United States Patent
Kawano et al.

(10) Patent No.: US 10,553,262 B2
(45) Date of Patent: Feb. 4, 2020

(54) MEMORY SYSTEM AND MEMORY DEVICE

(71) Applicant: TOSHIBA MEMORY CORPORATION, Tokyo (JP)

(72) Inventors: Hiroyuki Kawano, Yokohama Kanagawa (JP); Kousuke Fujita, Yokohama Kanagawa (JP); Toshiya Matsuda, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/116,482

(22) Filed: Aug. 29, 2018

(65) Prior Publication Data

US 2019/0180800 A1    Jun. 13, 2019

(30) Foreign Application Priority Data

Dec. 13, 2017  (JP) ................................. 2017-238781

(51) Int. Cl.
*G11C 7/22*     (2006.01)
*G06F 13/16*    (2006.01)
*G06F 12/02*    (2006.01)
*G11C 7/10*     (2006.01)

(52) U.S. Cl.
CPC ............ *G11C 7/22* (2013.01); *G06F 12/0238* (2013.01); *G06F 13/1668* (2013.01); *G11C 7/1096* (2013.01)

(58) Field of Classification Search
None
See application file for complete search history.

(56) References Cited

U.S. PATENT DOCUMENTS

| | | | |
|---|---|---|---|
| 8,352,807 B2 | 1/2013 | Yamashita et al. | |
| 2010/0169556 A1 | 7/2010 | Nakanishi et al. | |
| 2017/0102893 A1* | 4/2017 | Yoon ..................... | G06F 3/0604 |

FOREIGN PATENT DOCUMENTS

| | | |
|---|---|---|
| JP | 2011065313 A | 3/2011 |
| JP | 5300496 B2 | 9/2013 |
| JP | 5458568 B2 | 4/2014 |

* cited by examiner

*Primary Examiner* — James G Norman
(74) *Attorney, Agent, or Firm* — Kim & Stewart LLP

(57) ABSTRACT

A memory system includes a memory device having a controller and a memory cell array, and a host device connected to the memory device and configured to transmit a first request for storing internal information of the memory device and a second request for acquiring internal information of the memory device. The controller, in a first control mode, writes data in the memory in response to a write request from the host device and reads data from the memory in response to a read request from the host device, in a second control mode, does not respond to write and read requests from the host device, and when receiving the first or second request, shifts from the first control mode to the second control mode, performs an operation according to the first or second request, and shifts to the first control mode without restarting or initializing the memory device.

20 Claims, 16 Drawing Sheets

MEMORY SYSTEM AND MEMORY DEVICE

CROSS-REFERENCE TO RELATED APPLICATION

This application is based upon and claims the benefit of priority from Japanese Patent Application No. 2017-238781, filed Dec. 13, 2017, the entire contents of which are incorporated herein by reference.

FIELD

Embodiments described herein relate generally to a memory system and a memory device.

BACKGROUND

A known memory system conforming to a UFS (universal flash storage) standard includes a host device and a memory device based on a client-server model.

DETAILED DESCRIPTION

Figure 1:
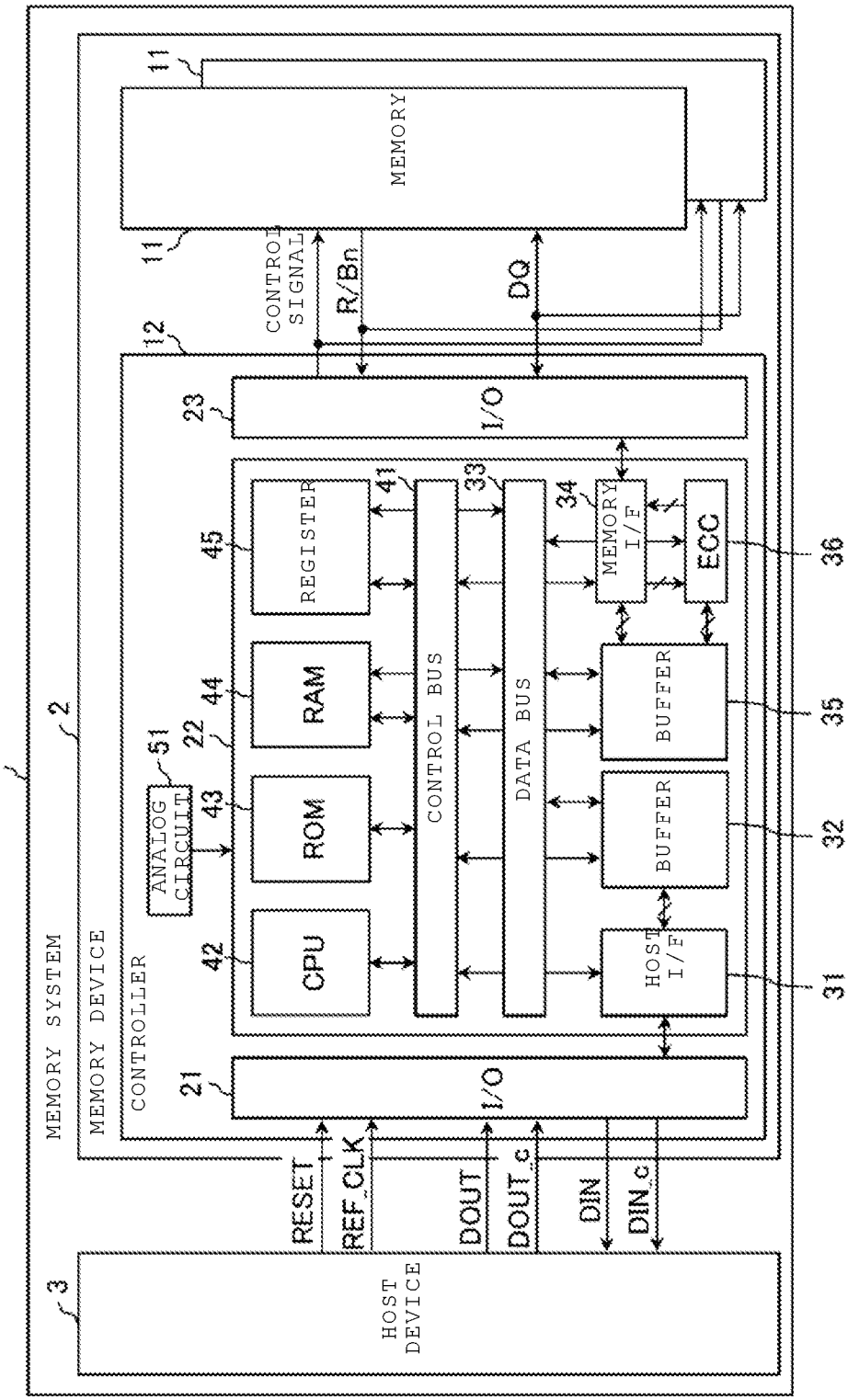
FIG. 1 is a block diagram of a memory system according to a first embodiment.

Embodiments provide a memory system and a memory device in which the time required to perform an analysis operation when an abnormality occurs can be reduced.

In general, according to one embodiment, a memory system includes a memory device having a controller and a memory cell array, and a host device connected to the memory device and configured to transmit a first request for storing internal information of the memory device and a second request for acquiring internal information of the memory device. The controller, when in a first control mode, writes data in the memory in response to a write request from the host device and reads data from the memory in response to a read request from the host device, the controller, when in a second control mode, does not respond to write requests and read requests from the host device, and when the controller receives the first or second request, the controller shifts from the first control mode to the second control mode, performs an operation according to the first or second request, and after the operation, shifts from the second control mode to the first control mode without restarting or initializing the memory device.

Hereinafter, example embodiments will be described with reference to the drawings. In the following description, the same reference numerals are used to designate elements having approximately the same functions and configurations. The technical concepts described in conjunction with the example embodiments of the present disclosure do not necessarily require specific materials, shapes, structures, layouts or the like of components unless explicitly noted. In general, various changes to example embodiments can be made without departing from the intended scope of the present disclosure.

1. First Embodiment

A memory system according to a first embodiment will be described. In the first embodiment, a memory system conforms to a UFS standard and includes a host device and a memory device.

1.1 Configuration 1.1.1 Overall Configuration of Memory System

FIG. 1 illustrates a hardware configuration of a memory system. In FIG. 1, some of inter-block connections are indicated by arrows, but the inter-block connections are not limited to those specifically depicted.

As illustrated in FIG. 1, a memory system 1 includes a memory device 2 and a host device 3. The memory device 2 can communicate with the host device 3 using a client-server model. The memory device 2 operates as a target and the host device 3 operates as an initiator. As a specific example, the memory device 2 is a UFS memory device and the host device 3 is a host device that supports the UFS memory device. The host device 3, for example, is a SoC (system on chip) device and may be a device installed in a smart phone, a digital camera or the like.

The memory device 2 includes a nonvolatile semiconductor memory 11 (hereinafter, referred to as a "memory") and a controller 12 for controlling the memory 11.

The memory 11 performs data write and read operations in a specified writing unit including a plurality of bits. Moreover, the memory 11 erases data in an erasing unit including a plurality of write units. For example, the memory 11 includes at least one NAND type flash memory. When the memory 11 is a NAND flash memory, the memory 11 performs write and read operations in units of pages. In the present example, the memory 11 is a three-dimensional stack type NAND flash memory in which memory cell transistors are three-dimensionally stacked on a semiconductor substrate. However, the memory is not limited to a three-dimensional stack type NAND flash memory, and may be a planar type NAND flash memory in which memory cell transistors are two-dimensionally arranged on a semiconductor substrate or other nonvolatile memory types.

The memory device 2 includes an input/output interface (I/O) 21, a core logic unit 22, and an input/output interface (I/O) 23. The I/O 21 includes a hardware configuration for connecting the memory device 2 to the host device 3. The memory device 2 is connected to the host device 3 via a host bus. When the memory system 1 conforms to a UFS standard, the host bus corresponds to a serial interface. Signals transmitted between the memory device 2 and the host device 3 include RESET, REF_CLK, DOUT, DOUT_c, DIN, and DIN_c. Signals RESET, REF_CLK, DOUT, DOUT_c, DIN, and DIN_c are communicated between the host device 3 and the I/O 21 via the host bus. RESET is a hardware reset signal. REF_CLK is a reference clock signal. DOUT and DOUT_c are signals are a differential signal pair and are transmitted from the host device 3 to the memory device 2. The DIN and the DIN_c are signals are a differential signal pair and are transmitted from the memory device 2 to the host device 3.

The core logic unit 22 is connected to the I/O 21 and the I/O 23 in the controller 12. The I/O 23 includes a hardware configuration for connecting the controller 12 to the memory 11.

The core logic unit 22 includes a host interface 31, a buffer 32, a data bus 33, a memory interface 34, a buffer 35, an error correcting code (ECC) circuit 36, a control bus 41, a central processing unit (CPU) 42, a read only memory (ROM) 43, a random access memory (RAM) 44, and a register 45.

The I/O 21 is connected to the host interface 31. The host interface 31 performs processing required when the memory device 2 and the host device 3 communicate with each other. More specifically, the host interface 31 performs communication between the memory device 2 and the host device 3 according to a communication protocol to which the memory device 2 and the host device 3 both conform. When the memory device 2 is a UFS memory device, the host interface 31 is a UFS interface for example. A UFS interface conforms to a M-PHY standard for a physical layer and a UniPro standard for a link layer.

The host interface 31 is connected to the buffer 32. The buffer 32 receives, via the host interface 31, data transmitted from the host device 3 to the memory device 2 and temporarily stores this received data. Furthermore, the buffer 32 temporarily stores data which is transmitted from the memory device 2 to the host device 3 via the host interface 31. The buffer 32 is connected to the data bus 33.

The I/O 23 is connected to the memory interface 34. The memory interface 34 performs processing required when the controller 12 communicates with the memory 11. More specifically, the memory interface 34 transmits an instruction (e.g., a control signal) from the core logic unit 22 in a format recognizable by the memory 11. Moreover, the memory interface 34 transmits/receives a signal DQ to/from the memory 11 and receives a ready/busy signal R/Bn from the memory 11. The signal DQ, for example, includes data, an address, and a command. The signal R/Bn is a signal indicating that the memory 11 is in a busy state. When the memory 11 is a NAND flash memory, the memory interface 34 is a NAND flash interface.

The memory interface 34 is connected to the buffer 35. The buffer 35 receives, via the memory interface 34, data transmitted from the memory 11 to the controller 12 and temporarily stores the received data. Furthermore, the buffer 35 temporarily stores data which is to be transmitted from the controller 12 to the memory 11 via the memory interface 34. The buffer 35 is connected to the data bus 33. In some examples, the buffers 32 and 35 may be one single buffer. The memory interface 34 and the buffer 35 are connected to the ECC circuit 36. The ECC circuit 36 receives write data from the host device 3 via the data bus 33, adds an error correcting code (e.g., "parity") to the write data, and then supplies the buffer 35 with the write data with the parity added. Furthermore, the ECC circuit 36 receives, via the buffer 35, data supplied from the memory 11, performs error correction of this data by using parity, and supplies the data bus 33 with the error-corrected data.

The CPU 42, the ROM 43, the RAM 44, and the register 45 are connected to the control bus 41. The CPU 42, the ROM 43, the RAM 44, and the register 45 communicate with one another via the control bus 41.

The CPU 42 controls an overall operation of the memory device 2. The CPU 42 performs predetermined processes (a write operation, a read operation, an erasing operation and the like) according to a control program stored in the ROM 43. The CPU 42 performs predetermined processes for the memory 11 according to a command received from the host device 3.

When a read request including a command and a logical address is received from the host device 3, the CPU 42 reads logical/physical address conversion data (hereinafter, referred to as "logical/physical conversion data") which is stored in the memory 11, and converts the logical address in the read request into a physical address of the memory 11. The physical address specifies a particular part of the memory space of the memory 11. Furthermore, when a write request including a command, write data, and a logical address is received from the host device 3, the CPU 42 assigns a physical address corresponding to the logical address.

The ROM 43 stores a control program and the like to be executed by the CPU 42.

The RAM 44 is used as a work area of the CPU 42 and temporarily stores variable values and the like required for the work of the CPU 42.

The register 45 stores various values required for the operations of the memory device 2. The register 45 stores various values required when the host device 3 controls the memory device 2.

Moreover, the host interface 31, the buffer 32, the memory interface 34, and the buffer 35 are connected to the control bus 41. Based on the control program or an instruction from the host device 3, the CPU 42 controls the host interface 31, the buffer 32, the memory interface 34, and the buffer 35. Moreover, the controller 12 may be provided with an analog circuit 51.

1.1.2 Configuration of Memory

Figure 2:
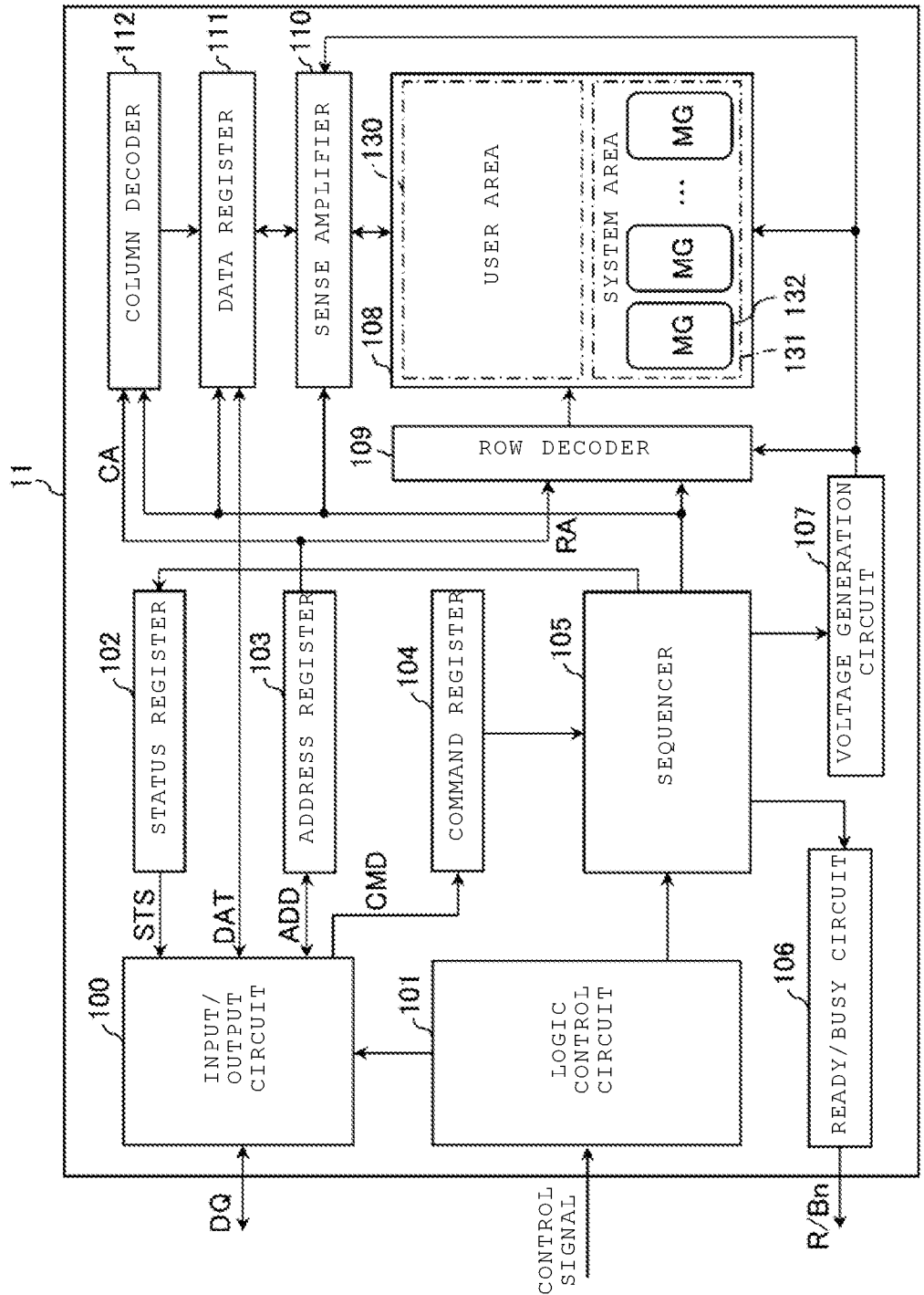
FIG. 2 is a block diagram of a memory unit in a memory system according to the first embodiment.

Next, the configuration of the memory 11 will be described using FIG. 2. In FIG. 2, some of inter-block connections are indicated by arrows, but the inter-block connections are not limited to those specifically depicted.

As illustrated in FIG. 2, the memory 11 includes an input/output circuit 100, a logic control circuit 101, a status register 102, an address register 103, a command register 104, a sequencer 105, a ready/busy circuit 106, a voltage generation circuit 107, a memory cell array 108, a row decoder 109, a sense amplifier 110, a data register 111, and a column decoder 112.

The input/output circuit 100 controls input/output of the signal DQ to/from the controller 12. More specifically, the input/output circuit 100 transmits, to the data register 111, data DAT (write data) received from the controller 12, transmits an address ADD to the address register 103, and transmits a command CMD to the command register 104. Furthermore, the input/output circuit 100 transmits, to the controller 12, status information STS received from the status register 102, data DAT (read data) received from the data register 111, and an address ADD received from the address register 103.

The logic control circuit 101 receives various control signals from the controller 12. Then, the logic control circuit 101 controls the input/output circuit 100 and the sequencer 105 according to the received control signals.

The status register 102 temporarily stores the status information STS in a write operation, a read operation, or an erasing operation, and notifies the controller 12 of whether an operation was normally completed.

The address register 103 temporarily stores the address ADD received from the controller 12 via the input/output circuit 100. Then, the address register 103 transmits a row address RA to the row decoder 109, and transmits a column address CA to the column decoder 112.

The command register 104 temporarily stores the command CMD received from the controller 12 via the input/output circuit 100, and transmits the command CMD to the sequencer 105.

The sequencer 105 controls an overall operation of the memory 11. More specifically, the sequencer 105, for example, controls the status register 102, the ready/busy circuit 106, the voltage generation circuit 107, the row decoder 109, the sense amplifier 110, the data register 111, the column decoder 112 and the like according to the command CMD stored by the command register 104, and performs write operations, read operations, erasing operations and the like.

The ready/busy circuit 106 transmits the ready/busy signal R/Bn to the controller 12 according to operation states of the sequencer 105.

The voltage generation circuit 107 generates voltages required for the write operation, the read operation, and the erasing operation under the control of the sequencer 105, and supplies the generated voltages to the memory cell array 108, the row decoder 109, the sense amplifier 110 and the like. The row decoder 109 and the sense amplifier 110 apply the supplied voltages to memory cell transistors in the memory cell array 108.

The memory cell array 108 includes a plurality of non-volatile memory cell transistors (also referred to as "memory cells") in rows and columns. The memory cell array 108 includes a user area 130 and a system area 131 as memory space areas.

The user area 130 is an area which is used for data received from the host device 3.

The system area 131, for example, is an area for storing system information for the memory device 2, such as a control program, logical/physical conversion data, and various parameter values such as applied voltages during the write operation. The system area 131 is an area where access by the host device 3 is not possible in write and read operations for the host device 3. The system area 131 includes memory groups MG. The sequencer 105 normally selects one memory group MG and stores the system information therein. When this memory group MG data is updated to some degree, the sequencer 105 copies the system information to another memory group MG and erases the system information of the original memory group MG in order to prevent destruction due to exhaustion.

When there is a request from the host device 3, internal information indicating an internal state of the memory device 2 is stored in a memory group MG in which system information is not stored. The internal information, for example, includes an error log for when an abnormality occurred in the memory device 2, information on the registers 102, 103, 104, and 111 and the sequencer 105, or various information required for failure analysis such as information indicating whether data of an address is valid (for example, to what extent did writing progress before the write operation was ended). The error log includes, for example, an abnormality cause, an abnormality place, time when abnormality occurred, and the like.

The row decoder 109 decodes the row address RA. Based on the decoding result, the row decoder 109 applies a voltage to the memory cell array 108.

The sense amplifier 110 senses data read from the memory cell array 108 in a read operation. Then, the sense amplifier 110 transmits the read data to the data register 111. Furthermore, the sense amplifier 110 transmits write data to the memory cell array 108 in a write operation.

The data register 111 includes a plurality of latch circuits. The latch circuits temporarily store the write data or the read data. For example, in the write operation, the data register 111 stores the write data received from the input/output circuit 100, and then transmits the write data to the sense amplifier 110. In the read operation, the data register 111 temporarily stores the data received from the sense amplifier 110, and transmits the data as read to the input/output circuit 100.

The column decoder 112, for example, decodes the column address CA in the write operation, the read operation, and the erasing operation, and selects the latch circuit in the data register 111 according to the decoding result.

1.1.3 Configuration of Memory Cell Array

Figure 3:
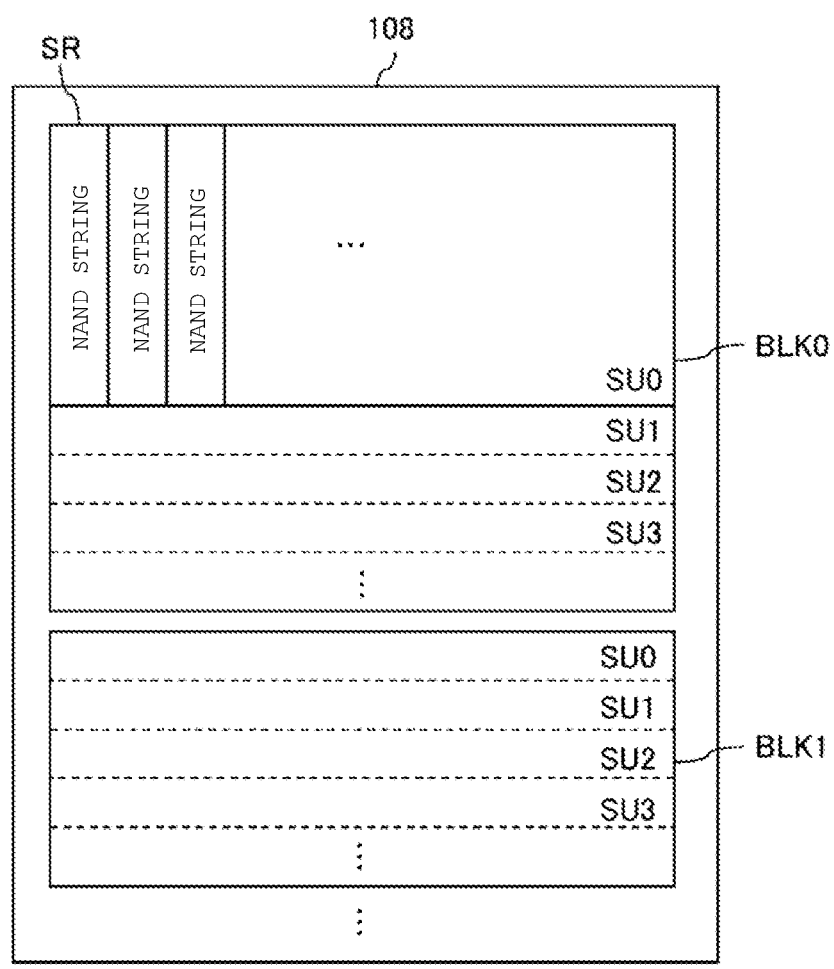
FIG. 3 is a block diagram of a memory cell array in a memory system according to the first embodiment.

FIG. 3 is a block diagram of the memory cell array 108. As illustrated in FIG. 3, the memory cell array 108 includes a plurality of blocks BLK (BLK0, BLK1 . . . ) each including memory cell transistors. Each of the blocks BLK includes a plurality of string units SU (SU0, SU1, SU2, SU3 . . . ). Each of the string units SU includes a plurality of NAND strings SR. The number of the blocks BLK in the memory cell array 108 and the number of the string units SU in each block BLK is arbitrary.

Likewise, assignment of each block BLK and/or each string unit SU to the user area 130 or the system area 131 is also arbitrary. For example, any block BLK may be assigned to the user area 130 and any other block BLK may be assigned to the system area 131. Furthermore, any string unit SU of a block BLK may be assigned to a memory group MG of the system area 131.

Next, the circuit configuration of the memory cell array 108 will be described. As an example, FIG. 4 illustrates the block BLK0, but configurations of other blocks BLK are substantially the same.

Figure 4:
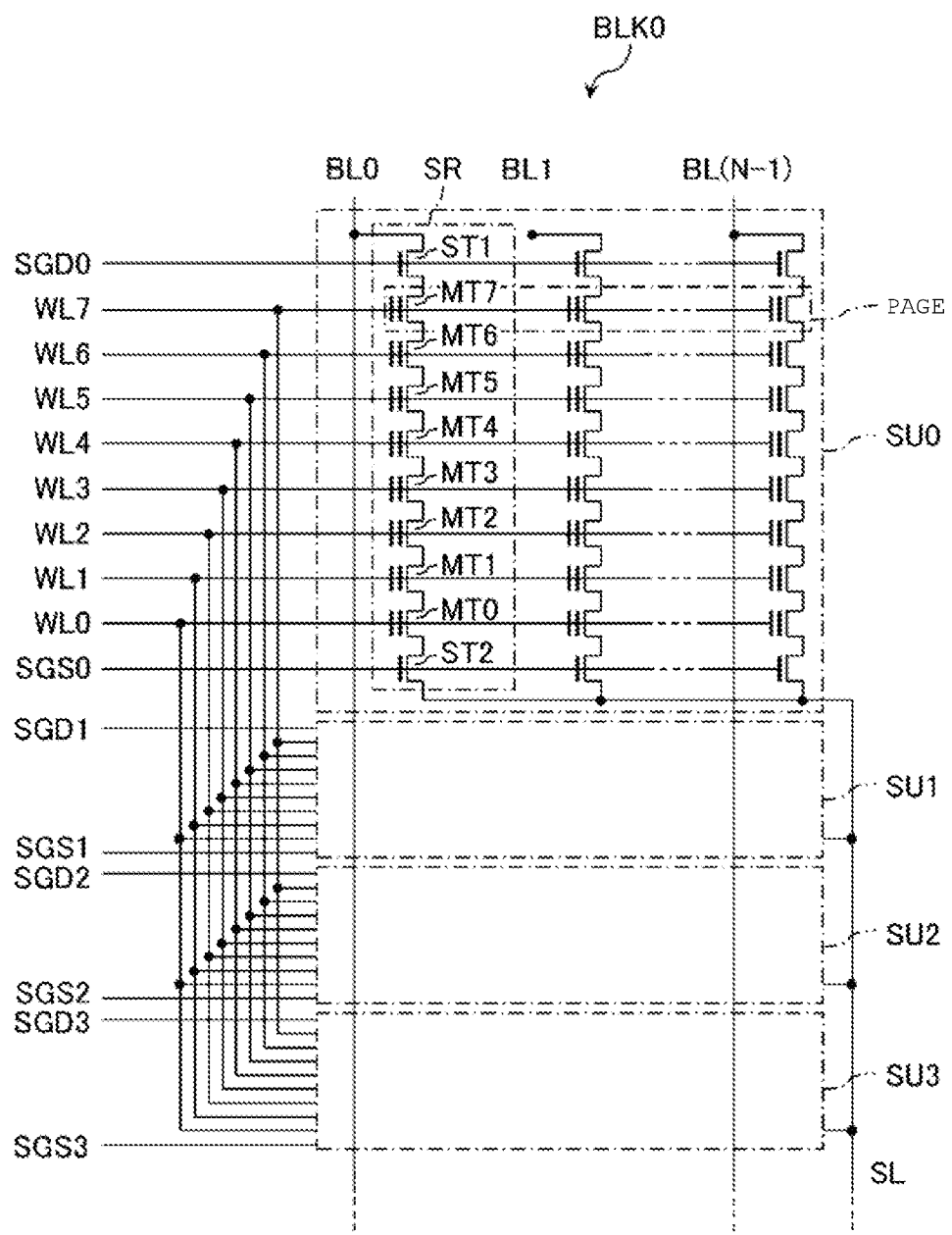
FIG. 4 is a circuit diagram of a memory cell array provided in a memory system according to the first embodiment.

As illustrated in FIG. 4, the block BLK0 includes four string units SU (SU0 to SU3). Each of the string units SU includes a plurality of NAND strings SR. Each of the NAND strings SR includes eight memory cell transistors MT0 to MT7 and two selection transistors ST1 and ST2. Hereinafter, the memory cell transistors MT0 to MT7 may be referred to in an undifferentiated or collective manner as memory cell transistors MT. The memory cell transistors MT each include a control gate and a charge storage layer and store data in a nonvolatile manner. In the memory cell transistor MT, threshold voltages are changed according to the number of electrons stored in the charge storage layer and information is stored in each memory cell transistor MT in accordance with different threshold voltage levels. The memory cell transistor MT may be a metal-oxide-nitride-oxide-semiconductor (MONOS) type transistor in which an insulating film is used as the charge storage layer or a floating gate (FG) type transistor in which a conductive layer is used as the charge storage layer. In the present embodiment, a MONOS type transistor will be described as an example. Furthermore, the number of the memory cell transistors MT in a NAND string SR is not limited to 8, and may be 16, 32, 64, 128, etc., that is, the number is not a limitation. Moreover, the number of the selection transistors ST1 and ST2 may be varied and it is sufficient for one of each (ST1 and ST2) selection transistors to be one or more.

The memory cell transistors MT are serially connected to one another between a source of the selection transistor ST1 and a drain of the selection transistor ST2. More specifically, current paths of the memory cell transistors MT0 to MT7 are serially connected to one another. A drain of the memory cell transistor MT7 is connected to the source of the selection transistor ST1, and a source of the memory cell transistor MT0 is connected to the drain of the selection transistor ST2.

For each of the string units SU0 to SU3, a gate of a selection transistor ST1 therein is connected to a respective one of the selection gate lines SGD0 to SGD3. Similarly, for each of the string units SU0 to SU3, a gate of the selection transistor ST2 therein is connected to a respective one of the selection gate lines SGS0 to SGS3. Hereinafter, when the selection gate lines SGD0 to SGD3 are not differentiated amongst themselves, they are referred to as selection gate lines SGD. When the selection gate lines SGS0 to SGS3 are not differentiated amongst themselves, they are referred to as selection gate lines SGS. The selection gate lines SGS0 to SGS3 for each string unit SU may be commonly connected to one another.

The control gates of the memory cell transistors MT0 to MT7 in the block BLK are connected to word lines WL0 to WL7, respectively. Hereinafter, when the word lines WL0 to WL7 are not differentiated amongst themselves, they are referred to as word lines WL.

The drains of the selection transistors ST1 of each NAND string SR in each string unit SU are respectively connected to different bit lines BL0 to BL(N-1) (where N is an integer equal to two or more). Hereinafter, when the bit lines BL0 to BL(N-1) are not differentiated amongst themselves, they are referred to as bit lines BL. Each bit line BL is connected to one NAND string SR in each string unit SU. Moreover, the sources of all the selection transistors ST2 are commonly connected to a source line SL. That is, each string unit SU is connected to multiple bit lines BL and is an aggregation of multiple NAND strings SR that are sharing the same selection gate lines SGD and SGS. Furthermore, the blocks BLK are an aggregation of multiple string units SU sharing word lines WL. The memory cell array 108 is an aggregation of a multiple blocks BLK sharing bit lines BL.

The write operation and the read operation are performed on the memory cell transistors MT connected to one word line WL in one string unit SU, and this collection or unit of data is called a "page".

When the memory 11 is a NAND flash memory, the memory 11 may be such that the memory cell transistors MT can acquire multiple states corresponding to two or more threshold voltage values. Thus, one memory cell transistor MT can store multi-values (multiple bits) of data beyond merely binary values. In the case of the memory cell transistor MT capable of storing such multi-values, more than one page is assigned to each word line WL.

1.1.4 Cross-Sectional View of Memory Cell Array

Figure 5:
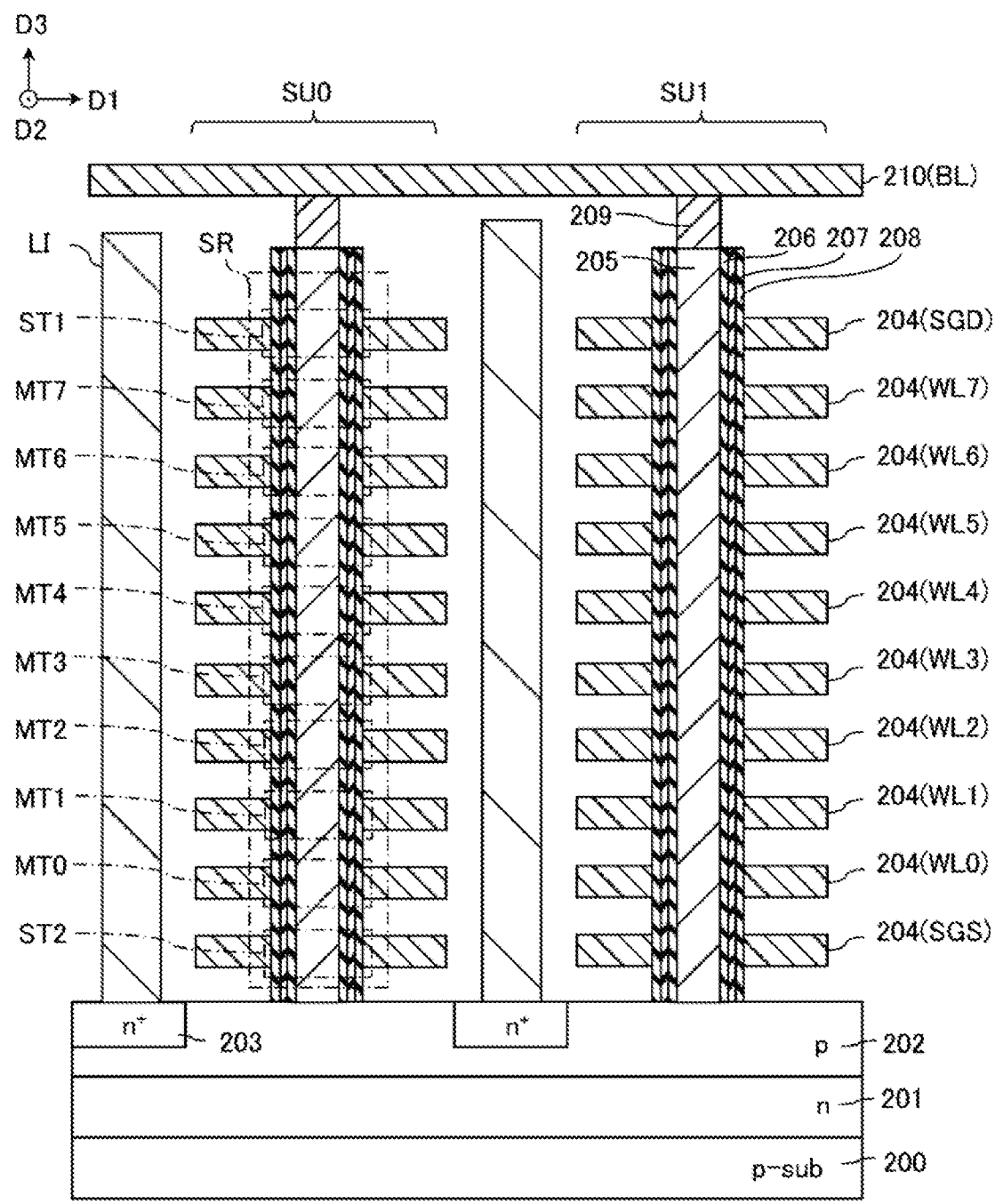
FIG. 5 is a cross-sectional view of a memory cell array in a memory system according to the first embodiment.

Next, the cross-sectional view of the memory cell array 108 will be described using FIG. 5. FIG. 5 is a cross-sectional view of the string units SU0 and SU1. The configurations of the string units SU2 and SU3 are similar. In FIG. 5, an interlayer insulating film otherwise present in an actual device is omitted from the depiction.

As illustrated in FIG. 5, source line contacts LI are distributed along a first direction D1 parallel to semiconductor substrate 200. The source line contacts LI each extend in a second direction D2 (e.g., in-out of page direction in FIG. 5) that is perpendicular to the first direction D1 and parallel to the semiconductor substrate 200. Between two adjacent source line contacts LI, one string unit SU is disposed. The source line contacts LI connect the semiconductor substrate 200 to a source lines SL (not specifically illustrated) located above the NAND strings SR. The particular arrangement of the source line contacts LI and the NAND strings SR on the substrate can be varied. For example, more than one string unit SU may be provided between two adjacent source line contacts LI. In the example of FIG. 5, in order to simplify description, the plurality of NAND strings SR in each string unit SU can be considered to be arranged in a single row along the second direction D2. However, the arrangement of the NAND strings SR can be varied. For example, NAND strings SR may be arranged in two rows in parallel to one another along the second direction D2 or may be arranged in four staggered rows.

In each string unit SU, the NAND strings SR are formed along a third direction D3 perpendicular to the semiconductor substrate 200. An n type well 201 is on semiconductor substrate 200. A p-type well 202 is on the n type well 201. An n+ type diffusion layer 203 is on portions of the surface of the p-type well 202. On the p-type well 202, the selection gate line SGS, the word lines WL0 to WL7 connected to the memory cell transistors MT0 to MT7, and an interconnection layer 204 with 10 layers serving as the selection gate line SGD are sequentially stacked with the interlayer insulating film therebetween.

A pillar-like semiconductor layer 205 passes through the interconnection layers 204 (10 layers in FIG. 5) and reaches the p-type well 202. On the lateral surface of the semiconductor layer 205, a tunnel insulating film 206, a charge storage layer 207, and a block insulating film 208 are sequentially formed. As the semiconductor layer 205, for example, polycrystalline silicon is used. As the tunnel insulating film 206 and the block insulating film 208, for example, a silicon oxide film is used. As the charge storage layer 207, for example, a silicon nitride film is used. The semiconductor layer 205 serves as a current path of the NAND string SR and becomes a region where a channel of each transistor is formed. An upper end of the semiconductor layer 205 is connected, via a contact plug 209, to an interconnection layer 210, which extends along the first direction D1. The interconnection layer 210 serves as a bit line BL. In the example of FIG. 5, one interconnection layer 204 is provided to serve as the selection gate line SGD and one interconnection layer 204 is provided to serve as the selection gate line SGS, however, a plurality of interconnection layers 204 may be provided for these purposes.

The source line contact LI extends as a continuous plate-like element along the second direction D2. As the source line contact LI, for example, polycrystalline silicon is used. A bottom surface of the source line contact LI is connected to the $n^+$ type diffusion layer 203 and its upper surface is connected to an interconnection layer serving as the source line SL.

1.1.5 Embodiment of Memory Device

Figure 6:
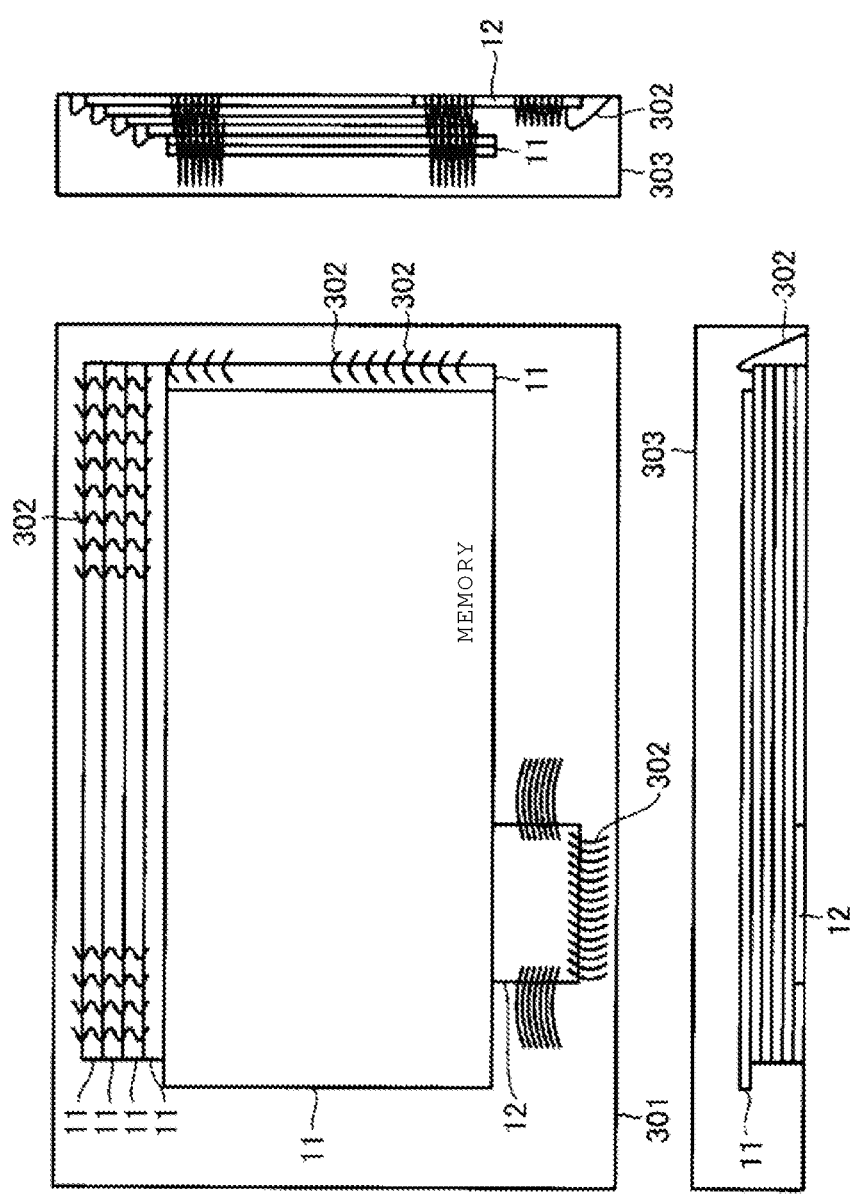
FIG. 6 is a diagram illustrating a mounting of a memory device in a memory system according to the first embodiment

Next, a memory device of an embodiment will be described using FIG. 6. The memory device 2, for example, may be an embedded type mounted on a printed circuit board by soldering or a removable type detachable from a card slot provided in the host device 3. FIG. 6 illustrates an example of a sealed-type memory device 2.

As illustrated in FIG. 6, a plurality of chip-like memories 11 is stacked on a printed circuit board 301. Each of the memories 11 is connected to an interconnection pattern (not specifically illustrated) on the printed circuit board 301 by wire(s) 302. A controller 12 is also placed on the printed circuit board 301 and is connected to the interconnection pattern by wire(s) 302. The controller 12 may be a chip-like structure. The printed circuit board 301 is provided on its rear surface with an external terminal, for example, a BGA (ball grid array). Various signals such as RESET, REF_CLK, DOUT, DOUT_c, DIN, and DIN_c, illustrated in FIG. 1, are assigned to external terminals, and are transmitted between the memory device 2 and the host device 3 via the external terminals. The printed circuit board 301, the memories 11, the controller 12, and the wires 302 can be sealed by a resin package 303.

1.2 Access of Host Device and Memory Device

Next, access of the host device 3 and the memory device 2 will be described.

1.2.1 Flow of Normal Operation Request in Host Device

Firstly, a flow when the host device 3 requests the memory device 2 to perform a normal operation such as write operation or a read operation will be described using FIG. 7. In the present embodiment, when the host device 3 transmits a request to the memory device 2 and there is no response to the request from the memory device 2, the host device 3 has a retry function capable of repeatedly transmitting the same request multiple times.

Figure 7:
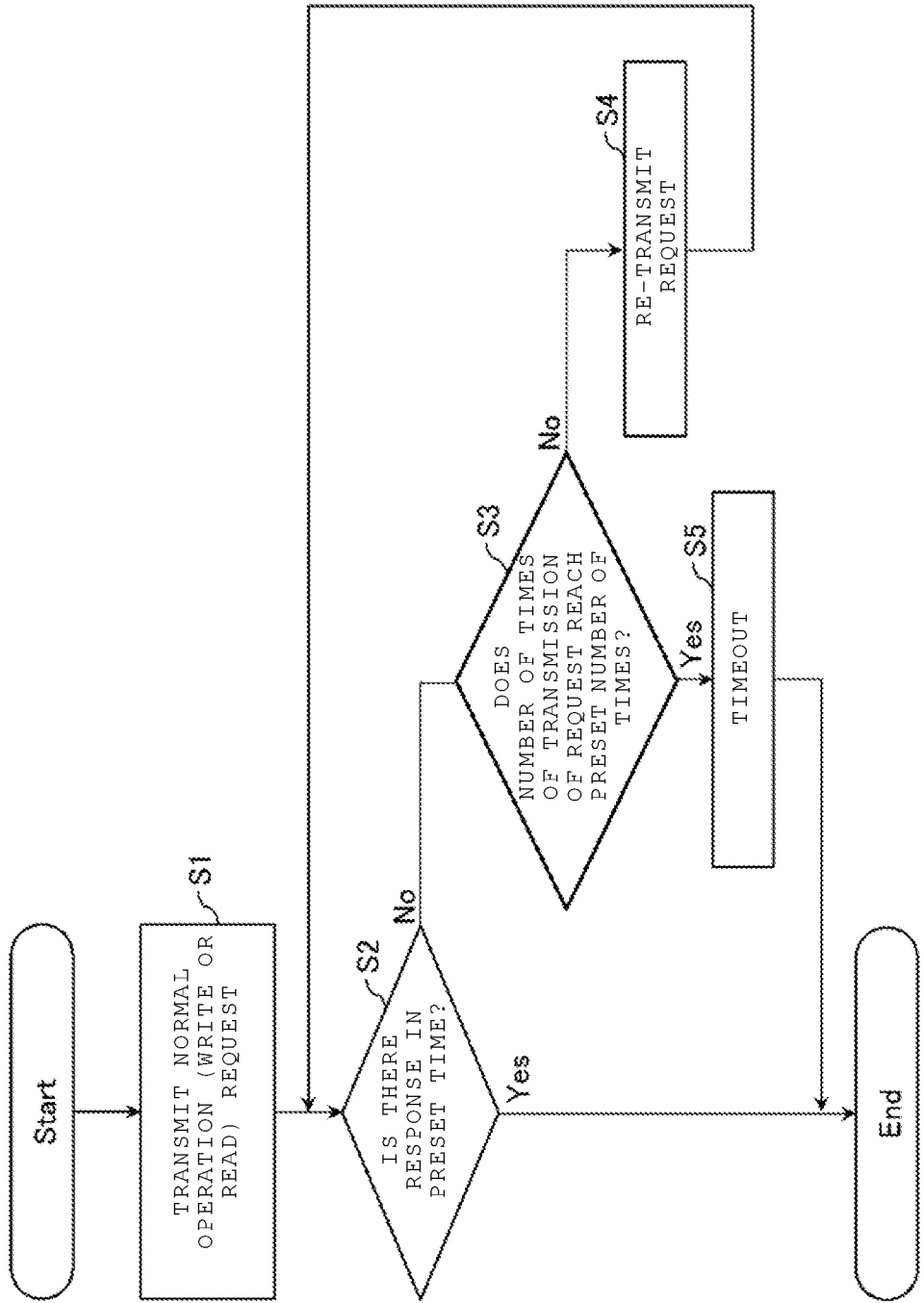
FIG. 7 is a flowchart of a normal operation in a host device of in a memory system according to the first embodiment.

As illustrated in FIG. 7, the host device 3 transmits a normal operation request to the memory device 2 (step S1). In the case of a write request, the host device 3 transmits a write command, a logical address, and write data (the data to be written according to the write command) to the memory device 2. In the case of a read request, the host device 3 transmits a read command and a logical address to the memory device 2.

When there is a response to the normal operation request from the memory device 2 within a preset time limit (step S2_Yes), the host device 3 ends the normal operation request. That is, the host device 3 ends the process associated with the already transmitted normal operation request.

On the other hand, when there is no response within the preset time limit (step S2_No), the host device 3 checks whether the number of repetitions of the transmission of the normal operation request to the memory device 2 has reached a preset number of times (step S3).

When the number of repetitions of the transmission has not yet reach the preset number of times (step S3_No), the host device 3 retransmits the same operation request to the memory device 2 again (step S4).

On the other hand, once the number of repetitions of the transmission has reached the preset number of times, the host device 3 determines that a timeout has occurred (step S5) and terminates the normal operation request.

1.2.2 Overall Flow in Write Request

Next, an overall flow for a write request will be described using FIG. 8.

Figure 8:
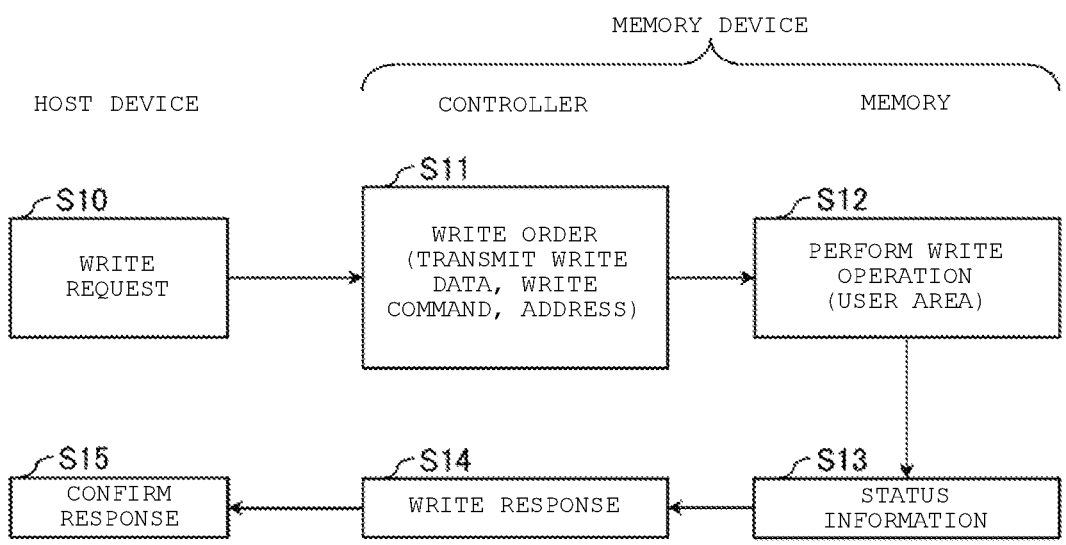
FIG. 8 is a flowchart of a write operation in a memory system according to the first embodiment.

As illustrated in FIG. 8, the host device 3 transmits a write request to the controller 12 of the memory device 2 (step S10).

The controller 12 transmits a write order to the memory 11 based on the write request (step S11). More specifically, the CPU 42 assigns a logical address, received from the host device 3, to a physical address for an unused page within the user area 130 of memory 11. Here, unused page refers to a page in which new data has not yet been written after any previous data stored therein has been erased. The CPU 42 issues a write command recognizable by the memory 11 as an instruction to perform operations related to writing data in the memory 11. The ECC circuit 36 adds a parity bit or the like to the write data received from the host device 3. Then, the write command, the physical address, and the write data with the added parity are transmitted to the memory 11 as a write order.

When the write order is received, the memory 11 performs a write operation (step S12). In this case, the data is to be written in the user area 130.

When the write operation is normally ended, the memory 11 transmits status information STS, which announces that the write operation was normally ended, to the controller 12 (step S13). More specifically, the controller 12 may confirm that the write operation has ended and the signal R/Bn has returned to a ready state from a busy state, then transmit a status information read command to the memory 11, and then read the status information STS from the memory 11.

When the status information STS indicating that the write operation was normally ended is received in turn from the memory 11, the controller 12 transmits a response (hereinafter, called a "write response") to the write request to the host device 3 (step S14).

When the write response from the controller 12 is confirmed, the host device 3 terminates the write request (step S15). When it is not possible to confirm the write response, the host device 3 retransmits the write request as described in FIG. 7.

1.2.3 Overall Flow in Read Request

Next, an overall flow in a read request will be described using FIG. 9.

Figure 9:
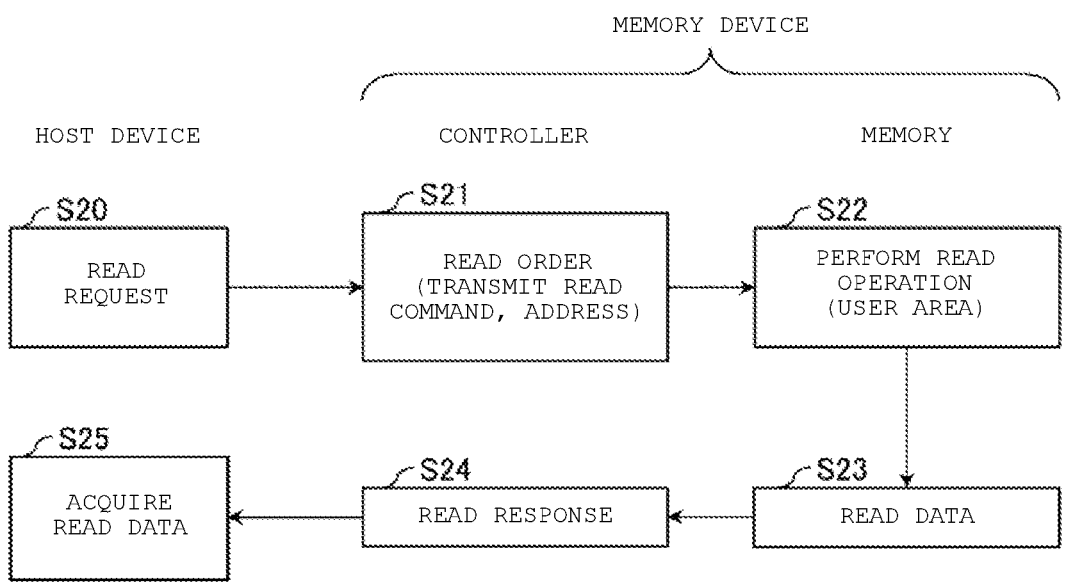
FIG. 9 is a flowchart of a read operation in a memory system according to the first embodiment.

As illustrated in FIG. 9, the host device 3 transmits a read request to the controller 12 of the memory device 2 (step S20).

The controller 12 transmits a read order to the memory 11 based on the read request (step S21). More specifically, the CPU 42 converts a logical address received from the host device 3 into a physical address based on stored logical/physical conversion data. Furthermore, the CPU 42 issues a read command recognizable by the memory 11 as an instruction to perform operations associated with reading data from the memory 11. Then, the read command and the physical address are transmitted to the memory 11 as a read order.

When the read order is received, the memory 11 performs a read operation (step S22). In this case, data is read from the user area 130.

When the read operation is ended, the memory 11 transmits the read data (the data that has been read from the memory according the read order) to the controller 12 (step S23).

The controller 12 performs an ECC process on the read data received from the memory 11, and then transmits error-corrected read data to the host device 3 as a response (hereinafter, called a "read response") to the read request (step S24).

When the read data is acquired from the controller 12, the host device 3 terminates the read request (step S25). When it is not possible to confirm the read response, the host device 3 retransmits the read request as described in FIG. 7.

1.2.4 Control Modes of Memory Device

Next, control modes of the memory device 2 will be described. The memory device 2 of the present embodiment has two control modes: a normal mode and an analysis mode. The control modes of the memory device 2 are managed by the controller 12.

The normal mode is a control mode which is selected when performing operations (a write operation, a read operation, an erasing operation or the like) requiring the accessing of the user area 130 of the memory cell array 108. For example, when there is the normal operation request from the host device 3 while the memory device 2 is in the normal mode state, the memory device 2 accesses the user area 130 and performs operations in accordance with the request.

The analysis mode is a mode which is selected when performing an operation involving accessing the system area 131 of the memory cell array 108. During the analysis mode, even though a request from the host device 3 might be received, the memory device 2 performs no operation(s) corresponding to the request and transmits no response to the host device 3.

For example, when an abnormality, such as timeout, occurs in the memory system 1, the host device 3 requests the memory device 2 to store and acquire various internal (to the memory device 2) information in order to analyze the cause of the abnormality event. When there is a request from the host device 3 for storing or acquiring the internal information, the memory device 2 shifts to the analysis mode to access the system area 131 of the memory 11. After the operation for accessing the system area 131 is ended, the memory device 2 returns to the normal mode without requiring a restart process and/or an initialization process.

Figure 10:
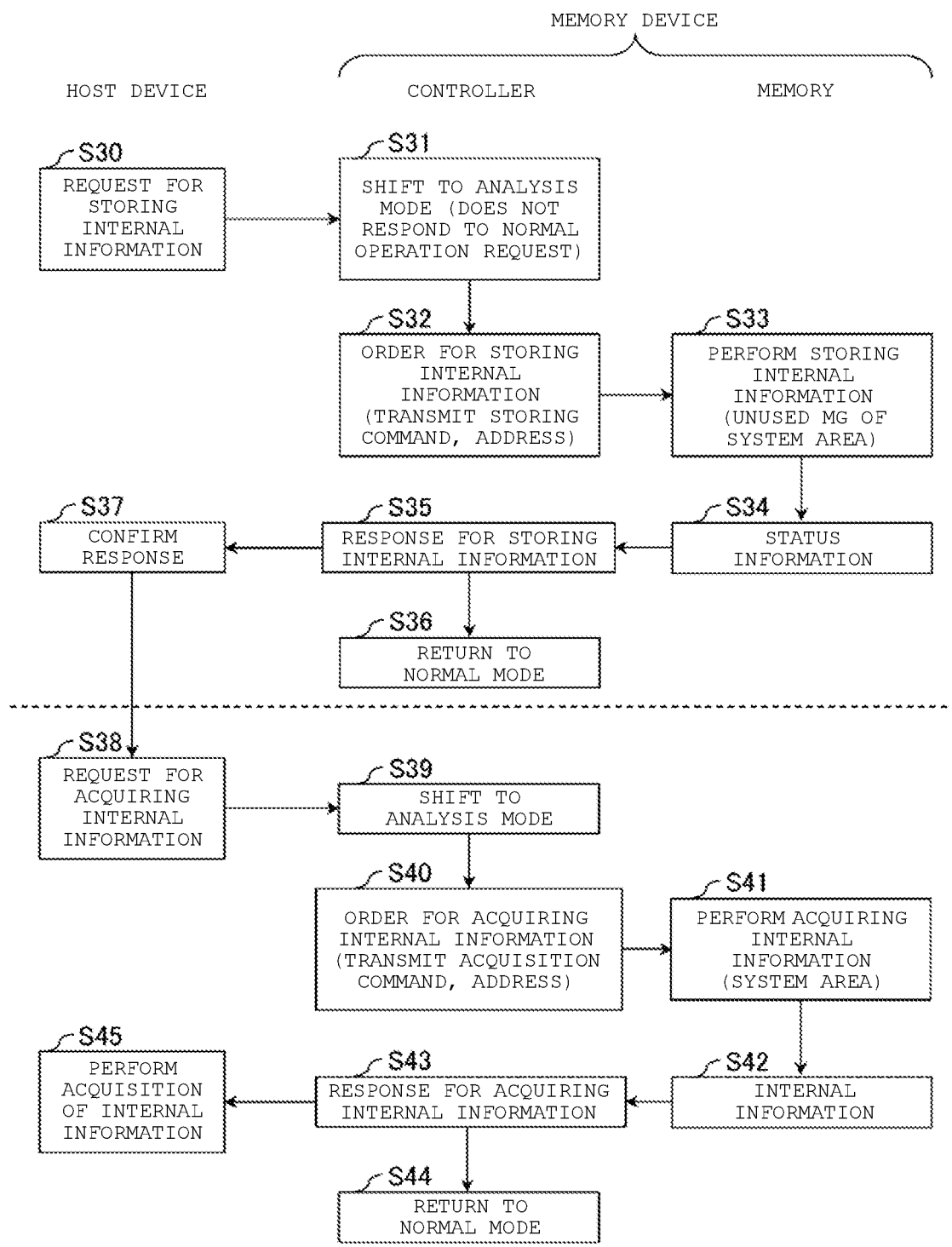
FIG. 10 is a flowchart of an internal information storing operation and an internal information acquisition operation in a memory system according to the first embodiment.

1.2.5 Overall Flow at the Time of Request for Storing Internal Information and Request for Acquiring Internal Information Firstly, an overall flow when there has been a request for storing internal information (referred to as a storing request) from the host device 3 will be described using FIG. 10. As illustrated in FIG. 10, the host device 3 transmits a storing request to the controller 12 to store internal information (step S30). For example, the storing request includes a storing order (that is, an order for storing internal information) and a logical address. The storing request does not include data.

The controller 12 shifts the control mode of the memory device 2 from the normal mode to the analysis mode. In the analysis mode, the controller 12 does not respond to the normal operation request from the host device 3 (step S31).

The controller 12 transmits an order for storing internal information (referred to as a storing order) to the memory 11 (step S32). More specifically, the CPU 42 assigns a logical address indicated in the storing request from the host device 3 to any one physical address of unused memory groups MG, in which no system information is stored. Furthermore, the CPU 42 issues a storing command that can be performed by the memory 11. Then, the CPU 42 transmits the storing command and the physical address to the memory 11 via the memory interface 34 as the storing order. In this case, the controller 12, for example, may also transmit information of the register 45 and may allow the information to be stored in the memory 11 as internal information.

When the storing order is received, the memory 11 performs a storing operation (that is a write operation) of the internal information (step S33). In this case, the internal information is written in the unused memory group MG of the system area 131, which corresponds to the physical address indicated in the storing request from the host device 3.

When the storing operation of the internal information is ended, the memory 11 transmits normal status information STS, which announces that the storing of the internal information was normally ended, to the controller 12 (step S34).

When the normal status information STS is received from the memory 11, the controller 12 transmits a response to the storing request (referred to as a storing response) to the host device 3 (step S35) and returns to the normal mode (step S36).

The host device 3 confirms the storing response from the controller 12 (step S37). In this way, the process according to the storing request is ended.

Subsequently, an overall flow when there has been a request for acquiring internal information (referred to as an acquiring request) from the host device 3 will be described.

The host device 3 confirms the storing response and then transmits the acquiring request to the controller 12 (step S38). For example, the acquiring request includes an acquisition order (that is, an order for acquiring internal information) and a logical address.

The controller 12 shifts to the analysis mode and does not respond to the normal operation request from the host device 3 (step S39).

The controller 12 transmits an order for acquiring internal information (referred to as an acquiring order) to the memory 11 (step S40). More specifically, the CPU 42 converts a logical address indicated in the acquiring order from the host device 3 into a physical address based on logical/physical conversion data. Furthermore, the CPU 42 issues an acquisition command that can be performed by the memory 11. Then, the CPU 42 transmits the acquisition command and the physical address to the memory 11 via the memory interface 34 as the acquiring order.

When the acquiring order is received, the memory 11 performs an acquiring operation (that is a read operation) of the internal information (step S41). In this case, the internal information is read from the memory group MG of the system area 131.

The memory 11 transmits the internal information to the controller 12 (step S42).

The controller 12 transmits the internal information as read from the memory 11 to the host device 3 as a response to the acquiring request (referred to as an acquiring response) (step S43) and returns to the normal mode (step S44).

The host device 3 acquires the internal information from the controller 12 (step S45). In this way, the process according to the acquiring request is ended.

In the flow of FIG. 10, the return to the normal mode of step S36 and the shift to the analysis mode of step S39 may be omitted. In this case, even in the analysis mode, it is sufficient if the memory device 2 can respond to the acquiring request from the host device 3. Moreover, the host device 3 may transmit one single request including the storing and acquiring requests to the memory device 2.

1.3 Specific Example of Access of Host and Memory Devices

Figure 11:
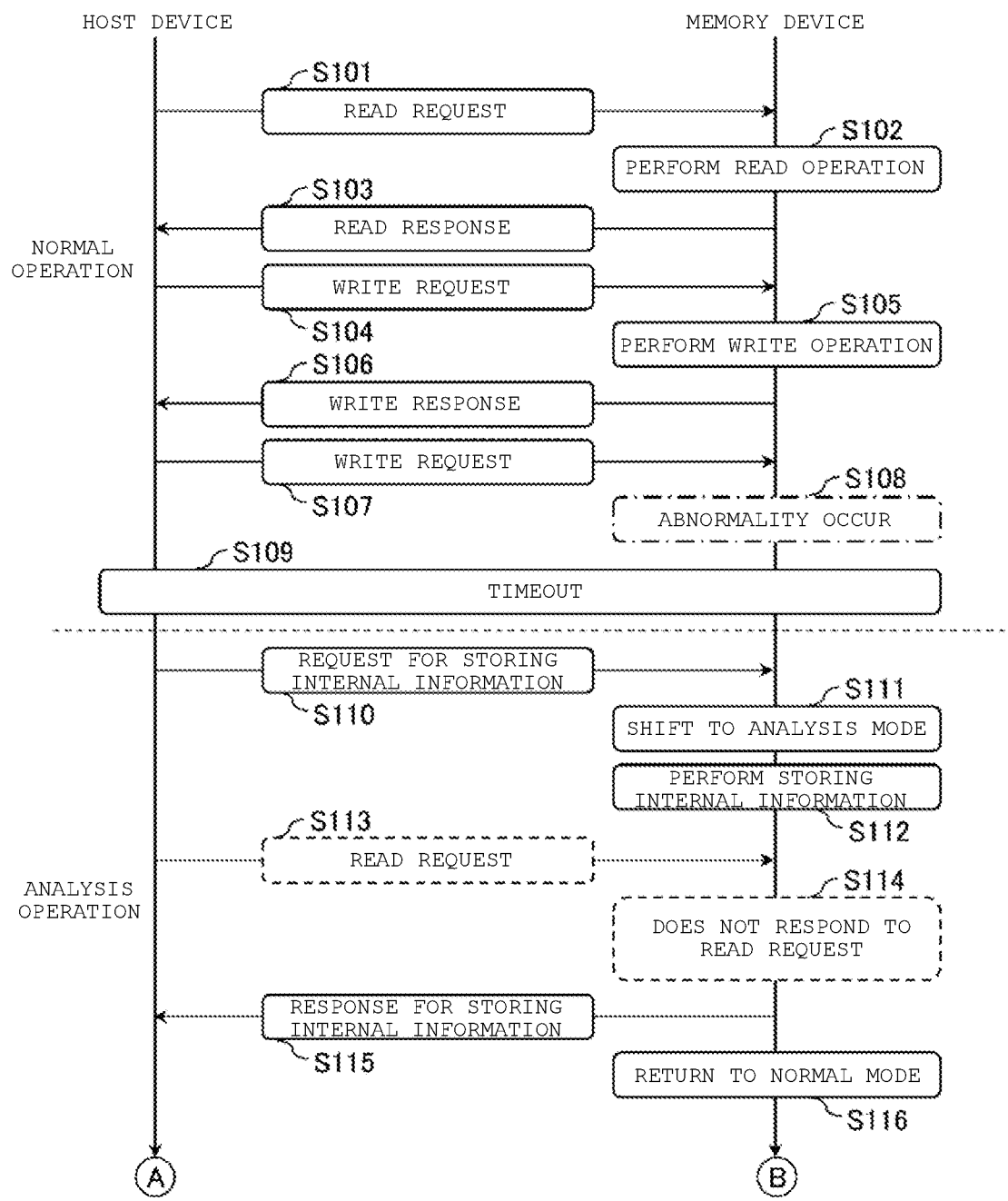
FIG. 11 is a flowchart illustrating a specific example of accessing of the host device and the memory device in a memory system according to the first embodiment.
Figure 12:
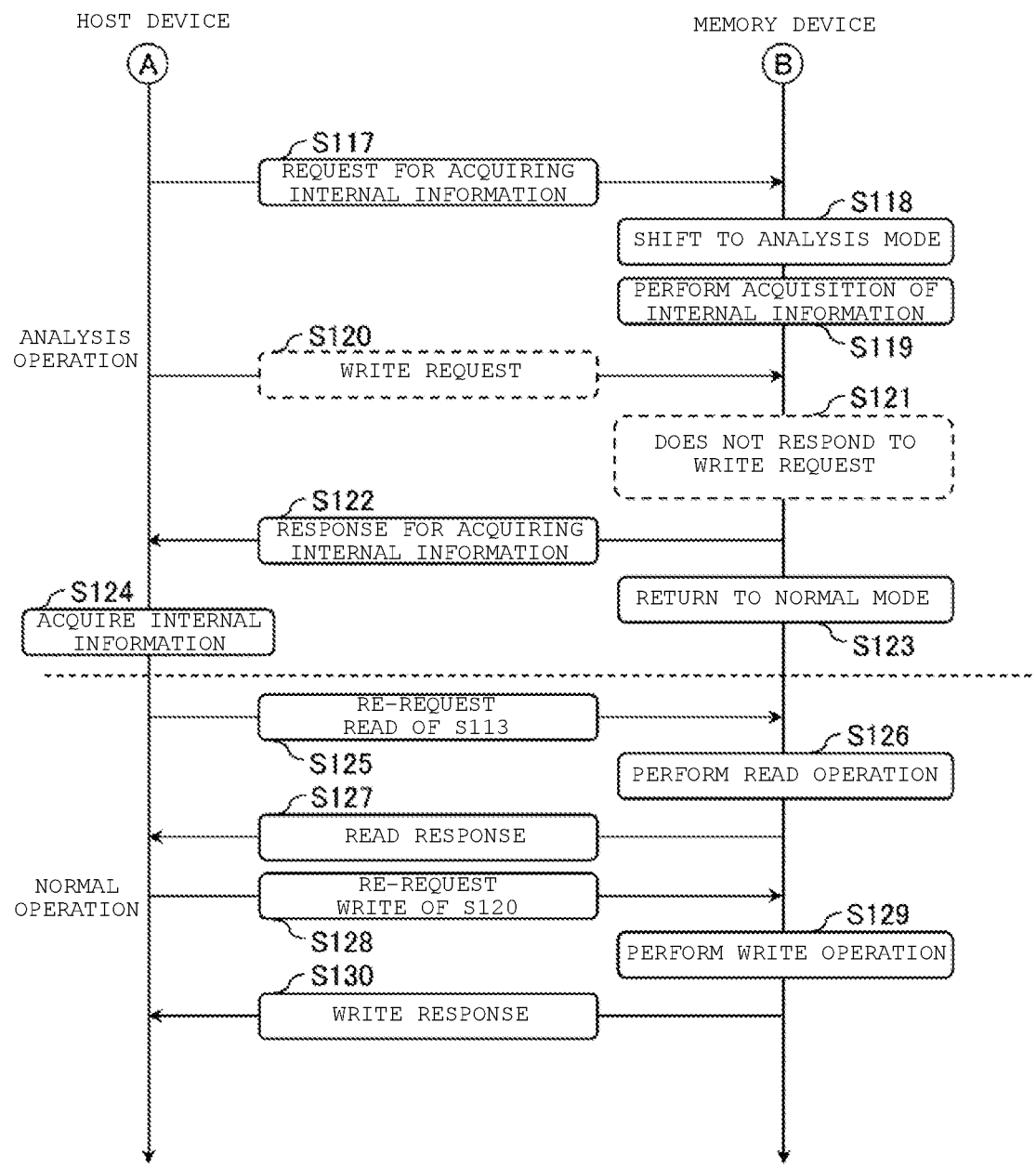
FIG. 12 is a flowchart illustrating a specific example of accessing of the host device and the memory device in a memory system according to the first embodiment.

Next, a specific example of accessing of the host device 3 and the memory device 2 will be described using FIGS. 11 and 12. In FIGS. 11 and 12, steps S101 to S109 illustrate a case where abnormality (consequently, a timeout) occurs in the normal operation (that is the write operation and the read operation) in the memory system 1. Steps S110 to S124 illustrate an analysis operation (that is storing and acquiring of the internal information). Steps S125 to S130 illustrate the normal operation after the analysis operation. During the analysis operation in the memory system 1, the host device 3 can transmit the normal operation request to the memory device 2.

As illustrated in FIG. 11, the host device 3, for example, transmits a read request to the memory device 2 (step S101). The memory device 2 performs a read operation (step S102) and then transmits a read response including data as read to the host device 3 (step S103). The host device 3 acquires the read data and ends the process according to the read request.

Furthermore, the host device 3, for example, transmits a write request to the memory device 2 (step S104). The memory device 2 performs a write operation (step S105) and then transmits a write response to the host device 3 (step S106). The host device 3 confirms the write response and ends the process according to the write request.

The host device 3 transmits a write request different from that of step S104 to the memory device 2 (step S107). In this case, when abnormality occurs in the memory device 2 (step S108) and the memory device 2 cannot respond to the request transmitted from the host device 3 multiple times, timeout occurs (step S109).

When the timeout occurs, the host device 3 shifts the memory system 1 to the analysis mode. More specifically, the host device 3 transmits the storing request to the memory device 2 (step S110). The memory device 2 shifts to the analysis mode (step S111) and stores internal information (step S112).

While the memory device 2 is storing the internal information in the memory system 1, the host device 3 may access the memory device 2 and, for example, transmit a read request (step S113). However, since the memory device 2 is in the analysis mode, the memory device 2 does not respond to the read request (step S114).

When the storing of the internal information is ended, the memory device 2 transmits a storing response to the host device 3 (step S115) and returns to the normal mode (step S116). The host device 3 confirms the storing response and ends the process according to the storing request.

As illustrated in FIG. 12, when the request for storing internal information is ended, the host device 3 transmits the acquiring request to the memory device 2 (step S117). The memory device 2 shifts to the analysis mode (step S118) and acquires the internal information (step S119).

While the memory device 2 is acquiring the internal information, the host device 3 may access the memory device 2 and, for example, transmit a write request (step S120). However, since the memory device 2 is in the analysis mode, the memory device 2 does not respond to the write request (step S121).

When the acquisition of the internal information is ended, the memory device 2 transmits an acquiring response to the host device 3 (step S122) and returns to the normal mode (step S123). The host device 3 acquires the internal information (step S124) and ends the process according to the acquiring request. In this way, the host device 3 shifts the memory system 1 to the normal operation.

The host device 3 may retransmits, to the memory device 2, the read request of step S113 to which no response was received from the memory device 2 (step S125). The memory device 2 performs a read operation (step S126) and then transmits a read response including data as read to the host device 3 (step S127). The host device 3 acquires the read data and ends the process according to the read request of step S113.

The host device 3 retransmits, to the memory device 2, the write request of step S120 to which no response was received from the memory device 2 (step S128). The memory device 2 performs a write operation (step S129) and then transmits a write response to the host device 3 (step S130). The host device 3 confirms the write response and ends the process according to the write request of step S120.

1.4 Effect According to Present Embodiment

According to the configuration according to the present embodiment, it is possible to shorten an analysis operation period when abnormality occurs in the memory system. Hereinafter, effects of the present embodiment will be described.

Figure 13:
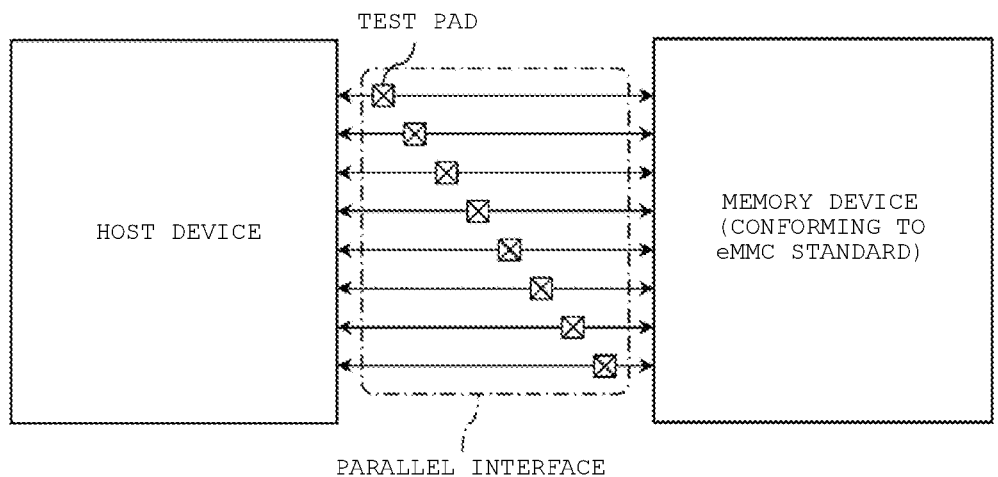
FIG. 13 is a diagram illustrating an example of a memory system conforming to an e-MMC (embedded multimedia card) standard.
Figure 14:
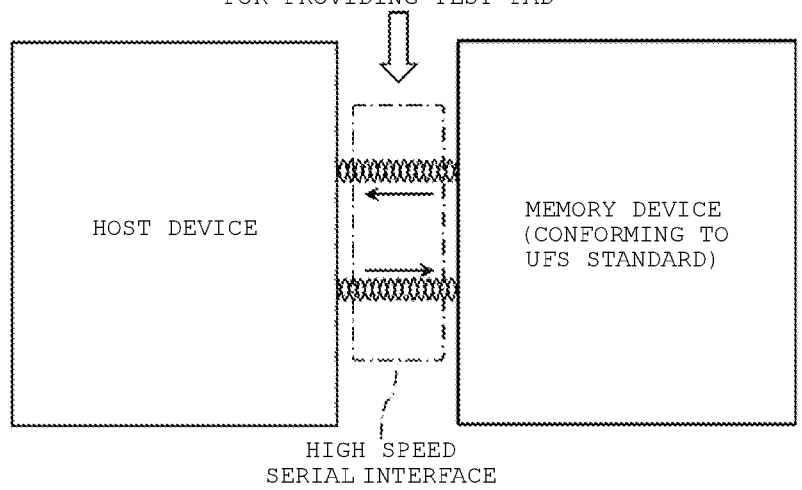
FIG. 14 is a diagram illustrating an example of a memory system conforming to a UFS standard.

Firstly, problems in existing protocol analysis methods in a memory system conforming to a UFS standard will be described using FIGS. 13 and 14. FIG. 13 illustrates an example of a memory system conforming to an embedded multimedia card (e-MMC) standard. FIG. 14 illustrates an example of a memory system conforming to the UFS standard.

In FIG. 13, a parallel interface conforming to the e-MMC standard is used for transmission/reception of data between a host device and a memory device. In this case, a communication path between the host device and the memory device can be extended to some degree, for example, long enough to insert a test pad on the communication path, without scarifying a communication speed conforming to the e-MMC standard. Accordingly, a cause of abnormality and a resulting timeout occurred in the memory system can be analyzed by connecting a protocol analysis device to the test pad.

In contrast, in FIG. 14, a high speed serial interface conforming to the UFS standard is used for transmission/reception of data between a host device and a memory device, wherein in the UFS standard, a communication speed is higher than that in the e-MMC standard. In this case, since a communication path is required to be short to achieve high speed communication, a test pad may not be inserted on the communication path. Furthermore, in a high speed serial interface conforming to the UFS standard, an insertion of a test pad on the communication path may degrade signal quality. Accordingly, protocol analysis between the devices using a test pad becomes difficult.

In some cases, a test board, devices and the like are provided, such that the memory device is transferred to the test board from a packaging board, and protocol analysis is performed. However, since an abnormal state in the memory device needs to be reproduced on the test board, a time duration required for an analysis (referred to as a reproduction test period) becomes long. Furthermore, when the memory device is transferred, the abnormal state may not be reproduced. The accuracy of protocol acquisition will be reduced due to data deficiency.

In some cases, a protocol may be acquired while the memory device is packaged. In this case, after a protocol analysis is performed on the abnormal state reproduced on the test board, the host device transmits a storing request and an acquiring request to the memory device, and extracts internal information from the memory device. In this case, it is necessary to prevent destruction of system information in the memory device during a storing operation and an acquisition operation. Therefore, when making the storing request and the acquiring request, the host device modifies a control program of the memory device such that the memory device can be prevented from receiving access of a normal operation (including a write operation, a read operation and the like) from the host device. After the internal information is stored and acquired, a restart process and an initialization process of the memory system are performed, and the memory device returns to ready for receiving access of the host device.

As described above, there are at least the following five problems with acquiring the internal information while the memory device is packaged.

Firstly, the reproduction test period of an abnormal state can be long. Furthermore, the restart process and the initialization process of the memory system are necessary when making the storing request and the acquiring request. Therefore, a time required for the analysis becomes relatively long.

Secondly, since there is a delay until abnormality is reproduced due to software correction of the memory device, an abnormal state will may not be reproduced.

Thirdly, since the memory system is restarted and initialized after an analysis, communication between the host device and the memory device is interrupted and thus there is a period that the host device cannot access the memory device. Therefore, even after occurrence of one abnormality, it may not be possible to continue an operation test in the memory system for an extended period of time.

Fourthly, when various types of abnormality continuously occur, the memory device is restarted and initiated after storing and acquisition of internal information in response to an initial occurrence of abnormality. Thus, it may not be possible to store the internal information in response to subsequent occurrences of abnormality.

Fifthly, when abnormality occurs in the memory system, the host device is not able to store and acquire the internal information of the memory device as desired. Therefore, a relatively long period of time is required when the memory device analyzes a cause of the abnormality.

In contrast, in the memory system according to the present embodiment, the host device 3 has a retry function of retransmitting a request when there is no response for the request from the memory device 2. The memory device 2 has two operations modes of the normal mode and the analysis mode. Furthermore, when the request for storing internal information (the storing request) and the request for acquiring internal information (the acquiring request) are received from the host device 3, the memory device 2 shifts to the analysis mode during the internal information storing operation and acquisition operation and does not respond to the request from the host device 3. Even though there is no response from the memory device 2 during the analysis mode, the host device 3 repeatedly transmits the same request multiple times, so that it is possible to avoid abnormality of the memory system due to no response. In this way, it is not necessary to rewrite the control program of the memory device 2 according to the request for storing internal information and the request for acquiring internal information, so that it is possible to eliminate the restart process and the initialization process. Accordingly, it is possible to shorten internal information storing and acquisition periods in the memory system 1. Thus, it is possible to shorten an analysis operation period when abnormality occurs in the memory system 1.

The memory device 2 includes a plurality of memory groups MG in the system area 131 of the memory 11, and can store internal information in a memory group MG in which no system information is stored. In this way, it is possible to reduce a probability that the system information will be destructed. Therefore, when abnormality occurred, internal information at that time is stored in a memory group MG in which no system information is stored, so that it is possible to omit a reproduction test.

Since software correction of the memory device is not necessary, there is a shorter delay until abnormality is reproduced, and thus it is possible to reduce a probability that an abnormal state will not be reproduced.

Since the memory system needs not be restarted and initialized after an operation test, communication between the host device and the memory device can be continued. Therefore, it is possible to continue an operation test in the memory system for a long period of time.

Even when various types of abnormality occur, the memory device needs not be restarted and initialized. Thus, it is possible to store internal information in response to subsequent occurrences of abnormality.

When abnormality occurs in the memory system, the host device can store and acquire the internal information of the memory device as desired.

2. Second Embodiment

In a second embodiment, various types of abnormality occur in the memory device 2.

2.1 Specific Example of Access of Host and Memory Devices

Figure 15:
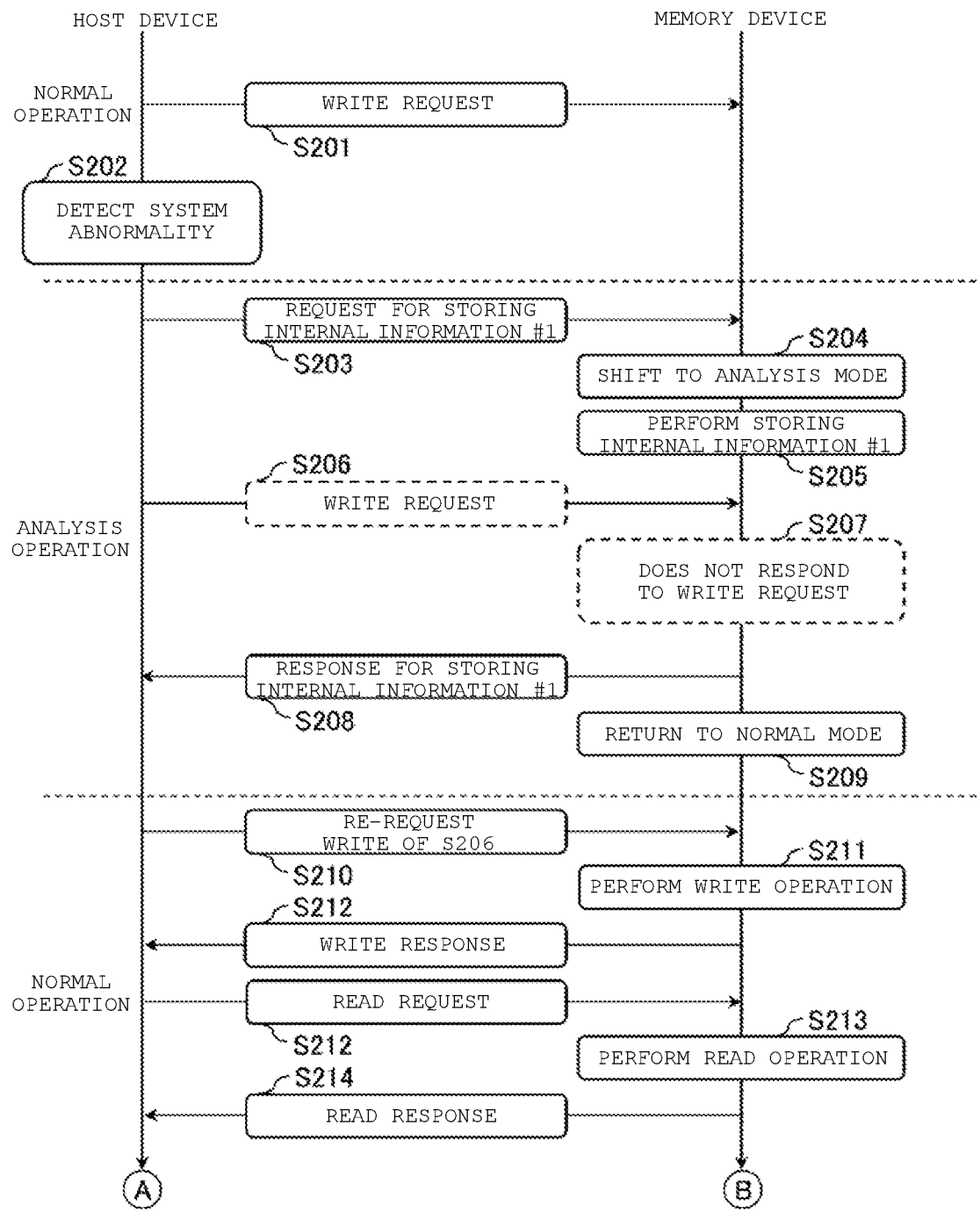
FIG. 15 is a flowchart illustrating a specific example of accessing of a host device and a memory device in a memory system according to a second embodiment.
Figure 16:
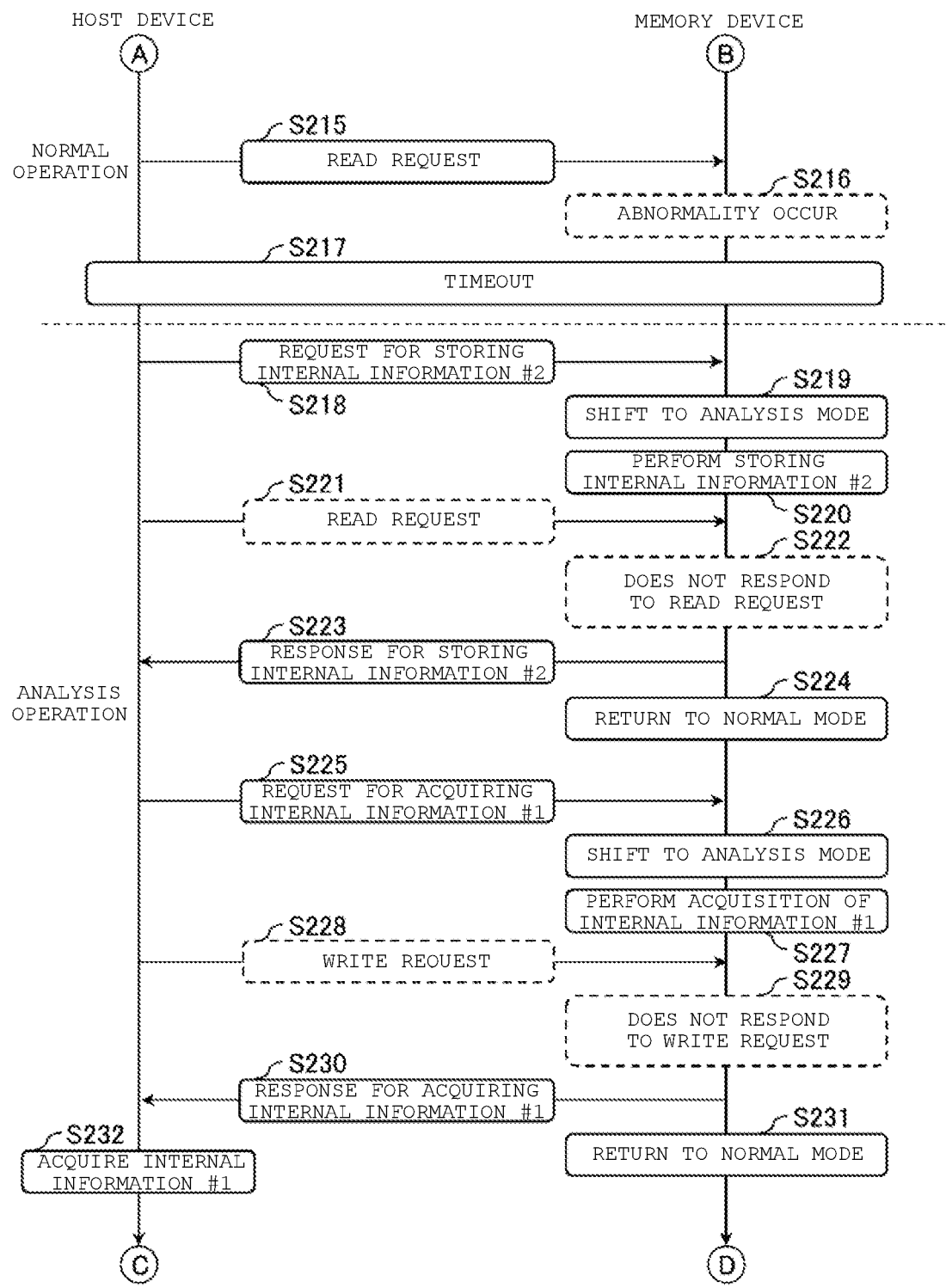
FIG. 16 is a flowchart illustrating a specific example of accessing of the host device and the memory device in a memory system according to the second embodiment.
Figure 17:
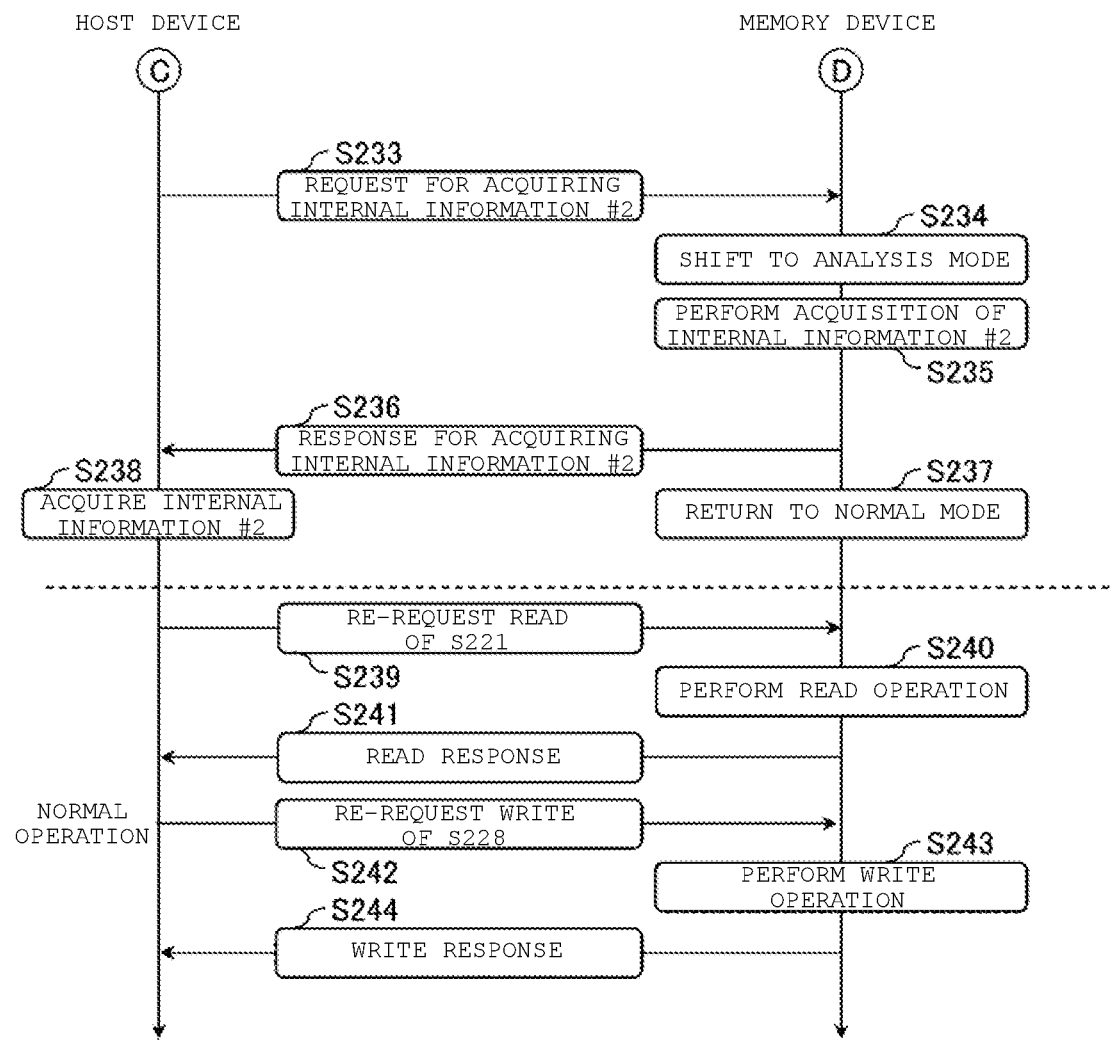
FIG. 17 is a flowchart illustrating a specific example of accessing of the host device and the memory device in a memory system according to the second embodiment.

Next, a specific example of accessing of the host device 3 and the memory device 2 will be described using FIGS. 15 to 17. In FIGS. 15 to 17, steps S201 and S202 illustrate a case where the host device 3 detects system abnormality in a normal operation of the memory system 1. Steps S203 to S209 and steps S218 to S237 illustrate an analysis operation. Steps S210 to S217 and steps S239 to S244 respectively illustrate the normal operation after the analysis operation.

As illustrated in FIG. 15, the host device 3 transmits a write request to the memory device 2 (step S201). After transmitting the write request, the host device 3 detects any abnormality of the memory system 1 (step S202). In this case, the abnormality of the memory system 1 may be a timeout due to the memory device 2 or other types of abnormality.

When the abnormality is detected, the host device 3 shifts the memory system 1 to the analysis mode. More specifically, the host device 3 transmits a request for storing internal information #1 corresponding to the abnormality the memory device 2 detected in step S202 (step S203). The memory device 2 shifts to the analysis mode (step S204) and performs storing the internal information of the memory system 1 (step S205).

In some cases, while the memory device 2 is storing the internal information #1, the host device 3 accesses the memory device 2 and for example, transmits a write request (step S206). However, since the memory device 2 is in the analysis mode, the memory device 2 does not respond to the write request (step S207).

When the storing of the internal information #1 is ended, the memory device 2 transmits a response for storing the internal information #1 to the host device 3 (step S208) and returns to the normal mode (step S209). The host device 3 confirms the response for storing the internal information #1 and ends the process according to the request for storing the internal information #1. In this way, the host device 3 shifts the memory system 1 to the normal operation.

The host device 3, for example, retransmits the write request of step S206 for which no response was obtained from the memory device 2 to the memory device 2 (step S210). The memory device 2 performs a write operation (step S211) and then transmits a write response to the host device 3 (step S212). The host device 3 confirms the write response and ends the process according to the write request of step S206.

Subsequently, the host device 3 transmits a read request to the memory device 2 (step S212). The memory device 2 performs a read operation (step S213) and then transmits a read response including the data as read to the host device 3 (step S214). The host device 3 acquires the read data and ends the process according to the read request.

As illustrated in FIG. 16, the host device 3 transmits a read request different from that of step S212 to the memory device 2 (step S215). In this case, for example, when abnormality occurs in the memory device 2 (step S216), timeout occurs (step S217).

When the timeout occurs, the host device 3 shifts the memory system 1 to the analysis operation. More specifically, the host device 3 transmits a request for storing internal information #2 corresponding to the timeout of step S217 to the memory device 2 (step S218). The memory device 2 shifts to the analysis mode (step S219) and performs storing the internal information #2 (step S220). In this case, the internal information #2 is stored in a memory group MG different from a memory group MG in which system information is stored and a memory group MG in which the internal information #1 is stored.

In some cases, while the memory device 2 is storing the internal information #2, the host device 3 accesses the memory device 2 and, for example, transmits a read request (step S221). However, since the memory device 2 is in the analysis mode, the memory device 2 does not respond to the read request (step S222).

When the storing of the internal information #2 is ended, the memory device 2 transmits a response for storing the internal information #2 to the host device 3 (step S223) and returns to the normal mode (step S224). The host device 3 confirms the response for storing the internal information #2 and ends the process according to the request for storing the internal information #2.

When the response for storing the internal information #2 is ended, the host device 3 transmits a request for acquiring the internal information #1 to the memory device 2 (step S225). The memory device 2 shifts to the analysis mode (step S226) and perform acquisition of the internal information #1 (step S227).

In some cases, while the memory device 2 is acquiring the internal information #1, the host device 3 accesses the memory device 2 and, for example, transmits a write request (step S228). However, since the memory device 2 is in the analysis mode, the memory device 2 does not respond to the write request (step S229).

When the acquisition of the internal information #1 is ended, the memory device 2 transmits a response for acquiring the internal information #1 to the host device 3 (step S230) and returns to the normal mode (step S231). The host device 3 acquires the internal information #1 (step S232) and ends the process according to the acquisition request of the internal information #1.

As illustrated in FIG. 17, when the acquisition request of the internal information #1 is ended, the host device 3 transmits an acquisition request of the internal information #2 to the memory device 2 (step S233). The memory device 2 shifts to the analysis mode (step S234) and performs acquisition of the internal information #2 (step S235).

When the acquisition of the internal information #2 is ended, the memory device 2 transmits a response for acquiring the internal information #2 to the host device 3 (step S236) and returns to the normal mode (step S237). The host device 3 acquires the internal information #2 (step S238) and ends the process according to the acquisition request of the internal information #2. In this way, the host device 3 shifts the memory system 1 to the normal operation.

The host device 3, for example, retransmits the read request of step S221 for which no response was obtained from the memory device 2 to the memory device 2 (step S239). The memory device 2 performs a read operation (step S240) and then transmits a read response including data as read to the host device 3 (step S241). The host device 3 acquires the read data and ends the process according to the read request of step S221.

Furthermore, the host device 3, for example, retransmits the write request of step S228 for which no response was obtained from the memory device 2 to the memory device 2 (step S242). The memory device 2 performs a write operation (step S243) and then transmits a write response to the host device 3 (step S244). The host device 3 confirms the write response and ends the process according to the write request of step S228.

2.2 Effect According to Present Embodiment

According to the configuration according to the present embodiment, it is possible to obtain effects similar to those of the first embodiment.

Moreover, according to the configuration according to the present embodiment, it is possible to store various types of internal information in different memory groups MG, respectively. For example, during a long operation test of the memory system 1, when various types of abnormality occurred, internal information is stored and the test is continued whenever abnormality occurs, and after the operation test is ended, it is possible to collectively acquire various types of internal information. In this way, even when abnormality occurred, it is possible to continue an operation test, so that it is possible to acquire internal information on continuous occurrence of abnormality.

3. Third Embodiment

In a third embodiment, the memory system 1 includes a plurality of memory devices 2 will be described.

3.1 Overall Configuration of Memory System

Figure 18:
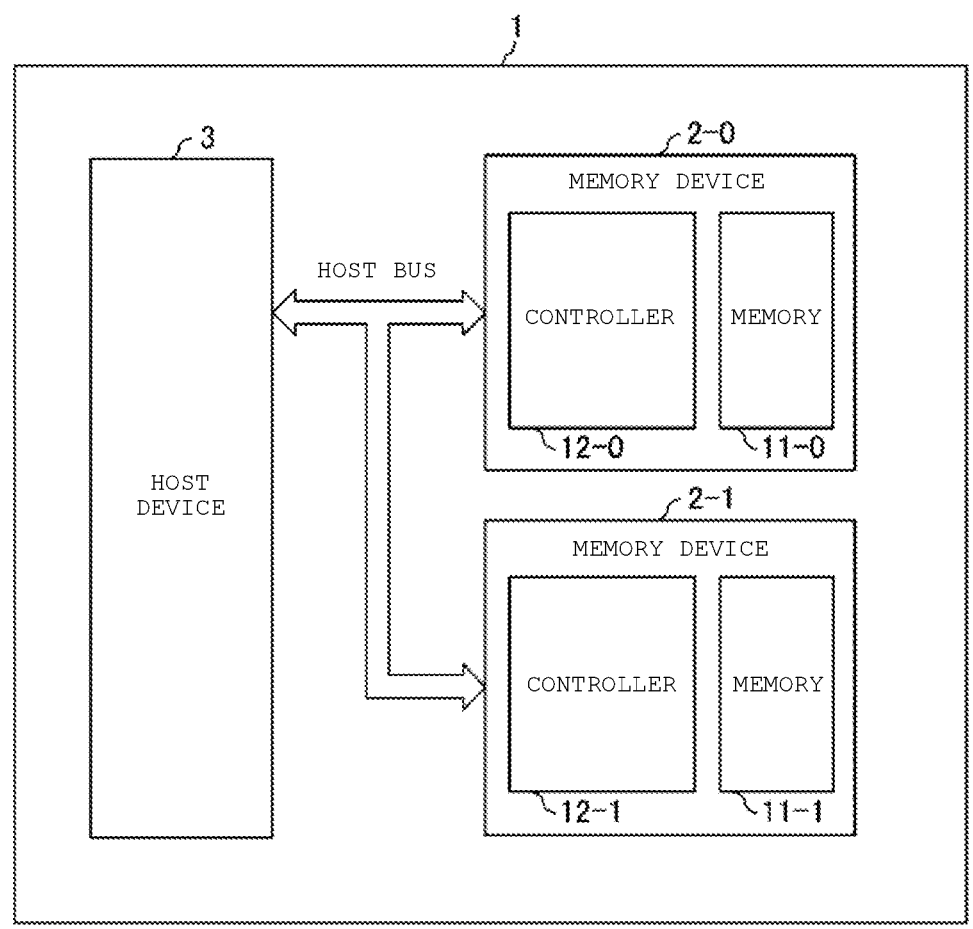
FIG. 18 is a block diagram of a memory system according to a third embodiment.

Next, an overall configuration of the memory system 1 will be described using FIG. 18. In the example of FIG. 18, in order to simplify description, details of memory devices 2-0 and 2-1 are omitted. However, the configurations of the memory devices 2-0 and 2-1 are the same as those of FIGS. 1 and 2 of the first embodiment.

As illustrated in FIG. 18, the memory system 1 includes the host device 3 and two memory devices 2 (2-0 and 2-1). The number of the memory devices 2 in the memory system 1 may be three or more. The host device 3 and the two memory devices 2 (2-0 and 2-1) are connected to each other via a host bus. Various signals transmitted/received between the memory devices 2 and the host device 3 via the host bus include RESET, REF_CLK, DOUT, DOUT_c, DIN, and DIN_c, similarly to the first embodiment. The respective signals may be separately assigned to the memory devices 2-0 and 2-1 (for example, RESET0 is transmitted to the memory device 2-0 and RESET1 is transmitted to the memory device 2-1) or may be common to the memory devices 2-0 and 2-1.

The memory device 2-0 includes a controller 12-0 and a memory 11-0. The configurations of the controller 12-0 and the memory 11-0 are the same as those of the first embodiment. Similarly, the memory device 2-1 includes a controller 12-1 and a memory 11-1.

3.2 Effect According to Present Embodiment

According to the configuration according to the present embodiment, effects similar to those of the first and second embodiments are obtained.

4. Modifications and the Like

The memory system according to the embodiments described above includes the host device 3 capable of transmitting the request for storing internal information and the request for acquiring internal information, and the memory device 2 that is connected to the host device 3, includes the memory 11 including the memory cell array 108 including a plurality of memory cells MT and the controller (12) for controlling the memory, and has a first control mode (the normal mode) and a second control mode (the analysis mode). When a write request or a read request is received from the host device, the controller responds to the received write request or read request in the case of the first control mode and does not respond to the received write request or read request in the second control mode. When the request for storing internal information or the request for acquiring internal information is received from the host device, the controller shifts from the first control mode to the second control mode and performs a storing operation or an acquisition operation of internal information. After the storing operation or the acquisition operation is ended, the controller shifts from the second control mode to the first control mode without restarting the memory device.

The present disclosure is not limited to the embodiments described above and various modifications can be made.

For example, in the embodiments described above, the memory system may conform to the e-MMC standard or may conform to other communication protocols. The memory system may be such that the host device has a retry function.

Moreover, the "connection" in the embodiments described above also includes a state in which elements such as transistors and resistors are interposed between other elements and they are indirectly connected to each other.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a memory device having a controller and a memory, the memory including a memory cell array; and
    a host device connected to the memory device and configured to transmit a first request for storing internal information of the memory device and a second request for acquiring internal information of the memory device, wherein
    the controller, when in a first control mode, writes data in the memory in response to a write request from the host device and reads data from the memory in response to a read request from the host device,
    the controller, when in a second control mode, does not respond to write requests and read requests from the host device, and
    when the controller receives the first or second request, the controller:
        shifts from the first control mode to the second control mode,
        performs an operation according to the first or second request, and
        after the operation, shifts from the second control mode to the first control mode without restarting or initializing the memory device.

2. The memory system according to claim 1, wherein the memory cell array comprises:
    a first system area in which the controller writes data in response to the write request and from which the controller reads data in response to the read request in the first control mode; and
    a second system area including a memory group in which the controller stores system information and a memory group in which the controller stores the internal information while in the second control mode.

3. The memory system according to claim 2, wherein the system information includes at least one of a control program, logical/physical data, and parameter values set for writing data in the memory.

4. The memory system according to claim 1, wherein the host device retransmits the write request or the read request to the memory device when there is no response from the memory device.

5. The memory system according to claim 1, wherein the internal information of the memory device includes an error log of an abnormality event in the memory device.

6. The memory system according to claim 1, wherein the memory device conforms to a universal flash storage (UFS) standard.

7. The memory system according to claim 1, further comprising a plurality of memory devices.

8. A memory device comprising:
    a memory connectable to a host device configured to transmit a first request for storing internal information of the memory device and a second request for acquiring internal information of the memory device, the memory device including a memory cell array; and
    a controller configured to control the memory in a first control mode and a second control mode, wherein
    the controller, when in the first control mode, writes data in the memory in response to a write request from the host device and reads data from the memory in response to a read request from the host device,
    the controller, when in the second control mode, does not respond to write requests and read requests from the host device, and
    when the controller receives the first or second request, the controller:
        shifts from the first control mode to the second control mode,
        performs an operation according to the first or second request, and after the operation, shifts from the second control mode to the first control mode without restarting or initializing the memory device.

9. The memory device according to claim 8, wherein the memory cell array comprises:
a first system area in which the controller writes data in response to the write request and from which the controller reads data in response to the read request in the first control mode; and
a second system area including a memory group in which the controller stores system information and a memory group in which the controller stores the internal information while in the second control mode.

10. The memory device according to claim 9, wherein the system information includes at least one of a control program, logical/physical data, and parameter values set for writing data in the memory.

11. The memory device according to claim 8, wherein the host device retransmits the write request or the read request to the memory device when there is no response from the memory device.

12. The memory device according to claim 8, wherein the internal information of the memory device includes an error log of an abnormality event in the memory device.

13. The memory device according to claim 8, wherein the memory device conforms to a universal flash storage (UFS) standard.

14. The memory device according to claim 8, wherein a plurality of memory devices is connectable to the host device.

15. A method of logging data, comprising:
when a memory device having a memory is in a first control mode, writing data in the memory in response to a write request from a host device and reading data from the memory in response to a read request from the host device, the memory including a memory cell array;
when the memory device is in a second control mode, not responding to write requests and read requests from the host device; and
when receiving a first request or a second request, shifting the memory device from the first control mode to the second control mode, performing an operation according to the first or second request, and after the operation, shifting from the second control mode to the first control mode without restarting or initializing the memory device, wherein
the first request is for storing internal information of the memory device, and
the second request is for acquiring internal information of the memory device.

16. The method of logging data according to claim 15, further comprising:
when the memory device is in the first control mode, writing data in a first system area of the memory cell array in response to the write request and reading data from the first system area of the memory cell array in response to the read request; and
when the memory device is in the second control mode, storing system information of the memory device in a memory group of a second system area and storing the internal information in another memory group.

17. The method of logging data according to claim 16, wherein, the system information includes at least one of a control program, logical/physical data, and parameter values set for writing data in the memory.

18. The method of logging data according to claim 15, further comprising:
re-receiving the write request or the read request from the host device when no response has been transmitted to the host device.

19. The method of logging data according to claim 15, wherein the internal information of the memory device includes an error log of an abnormality event in the memory device.

20. The method of logging data according to claim 15, wherein the memory device conforms to a universal flash storage (UFS) standard.

* * * * *